(12) United States Patent
Halbert et al.

(10) Patent No.: US 10,572,343 B2
(45) Date of Patent: Feb. 25, 2020

(54) TARGETED ALIASING SINGLE ERROR CORRECTION (SEC) CODE

(71) Applicant: Intel Corporation, Santa Clara, CA (US)

(72) Inventors: John B. Halbert, Beaverton, OR (US); Kjersten E. Criss, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 50 days.

(21) Appl. No.: 15/873,357

(22) Filed: Jan. 17, 2018

(65) Prior Publication Data

US 2018/0203761 A1 Jul. 19, 2018

Related U.S. Application Data

(60) Provisional application No. 62/448,122, filed on Jan. 19, 2017.

(51) Int. Cl.
*G11C 29/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .. G06F 11/1068; G06F 11/1012; G06F 12/06; G06F 12/0638; G06F 12/0292; G11C 29/4401; G11C 29/52; G11C 29/12005; G11C 29/1201; G11C 29/42; H03M 13/616; H03M 13/13; H03M 13/15; H03M 13/1575; H03M 13/27

See application file for complete search history.

(56) References Cited

U.S. PATENT DOCUMENTS

| | | | |
|---|---|---|---|
| 4,740,968 A * | 4/1988 | Aichelmann, Jr. | ............... G06F 11/1012 714/703 |
| 9,813,080 B1 * | 11/2017 | Micheloni | ............ H03M 13/114 |
| 10,268,539 B2 * | 4/2019 | Wu | ............ G06F 11/1068 |
| 2007/0089032 A1 * | 4/2007 | Alexander | ............ G06F 11/1024 714/763 |
| 2015/0089183 A1 * | 3/2015 | Bains | ............ G06F 12/06 711/202 |
| 2015/0378821 A1 * | 12/2015 | Manasse | ............ G06F 11/1076 714/764 |
| 2018/0351581 A1 * | 12/2018 | Presman | ............ H03M 13/2927 |

* cited by examiner

*Primary Examiner* — Guerrier Merant
(74) *Attorney, Agent, or Firm* — Compass IP Law PC

(57) ABSTRACT

A memory device is configured to provide internal or on-die ECC (error checking and correction or error correction coding). In such a system, the code matrix can be managed as four quadrants of (N/4) bits, with two adjacent quadrants in an (N/2)-bit segment or portion. The N codes of the matrix correspond to the N bits of a data word to be protected by the ECC. The code matrix includes M codes corresponding to the M ECC check bits. The memory device includes internal ECC circuitry to perform ECC in the DRAM device with the ECC bits and code matrix in response to a request to access the data word. The codes in a quadrant steer an aliased bit to a quadrant other than an adjacent quadrant.

21 Claims, 13 Drawing Sheets

H MATRIX 202

DATA BIT PORTION 210

CHECK BIT PORTION 220

H MATRIX 220
CHECK BIT PORTION SEC CODE

| CHK-BIT | 0 | 1 | 2 | 3 | 4 | 5 | 6 | 7 |
|---|---|---|---|---|---|---|---|---|
| CB[0] | 1 | 0 | 0 | 0 | 0 | 0 | 0 | 0 |
| CB[1] | 0 | 1 | 0 | 0 | 0 | 0 | 0 | 0 |
| CB[2] | 0 | 0 | 1 | 0 | 0 | 0 | 0 | 0 |
| CB[3] | 0 | 0 | 0 | 1 | 0 | 0 | 0 | 0 |
| CB[4] | 0 | 0 | 0 | 0 | 1 | 0 | 0 | 0 |
| CB[5] | 0 | 0 | 0 | 0 | 0 | 1 | 0 | 0 |
| CB[6] | 0 | 0 | 0 | 0 | 0 | 0 | 1 | 0 |
| CB[7] | 0 | 0 | 0 | 0 | 0 | 0 | 0 | 1 |

H MATRIX 210
DATA PORTION OF SEC CODE

| D-BIT | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| CB[0] | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| CB[1] | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| CB[2] | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| CB[3] | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| CB[4] | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 |
| CB[5] | 0 | 0 | 0 | 0 | 1 | 1 | 1 | 1 | 0 | 0 | 0 | 0 | 1 | 1 | 1 | 0 | 0 | 0 | 0 | 1 | 1 | 1 | 1 | 0 | 0 | 0 | 0 | 1 | 1 | 1 | 1 | 1 |
| CB[6] | 0 | 0 | 1 | 1 | 0 | 0 | 1 | 1 | 0 | 0 | 1 | 1 | 0 | 0 | 1 | 0 | 0 | 1 | 1 | 0 | 0 | 1 | 1 | 0 | 0 | 1 | 1 | 0 | 0 | 1 | 1 | 1 |
| CB[7] | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| QUADRANT | Q1 |||||||||||||||||||||||||||||||  |

| D-BIT | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|---|---|---|---|---|---|---|---|---|---|---|---|---|---|---|
| CB[0] | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| CB[1] | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| CB[2] | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| CB[3] | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| CB[4] | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 |
| CB[5] | 0 | 0 | 0 | 0 | 1 | 1 | 1 | 1 | 0 | 0 | 0 | 0 | 1 | 1 | 1 | 0 | 0 | 0 | 0 | 1 | 1 | 1 | 1 | 0 | 0 | 0 | 0 | 1 | 1 | 1 | 1 | 1 |
| CB[6] | 0 | 0 | 1 | 1 | 0 | 0 | 1 | 1 | 0 | 0 | 1 | 1 | 0 | 0 | 1 | 0 | 0 | 1 | 1 | 0 | 0 | 1 | 1 | 0 | 0 | 1 | 1 | 0 | 0 | 1 | 1 | 1 |
| CB[7] | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| QUADRANT | Q2 |||||||||||||||||||||||||||||||  |

| D-BIT | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 |
|---|---|---|---|---|---|---|---|---|---|---|---|---|---|---|---|---|---|---|---|---|---|---|---|---|---|---|---|---|---|---|---|---|
| CB[0] | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| CB[1] | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| CB[2] | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| CB[3] | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 |
| CB[4] | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 |
| CB[5] | 0 | 0 | 0 | 0 | 1 | 1 | 1 | 1 | 0 | 0 | 0 | 0 | 1 | 1 | 1 | 0 | 0 | 0 | 0 | 1 | 1 | 1 | 1 | 0 | 0 | 0 | 0 | 1 | 1 | 1 | 1 | 1 |
| CB[6] | 0 | 0 | 1 | 1 | 0 | 0 | 1 | 1 | 0 | 0 | 1 | 1 | 0 | 0 | 1 | 0 | 0 | 1 | 1 | 0 | 0 | 1 | 1 | 0 | 0 | 1 | 1 | 0 | 0 | 1 | 1 | 1 |
| CB[7] | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| QUADRANT | Q3 |||||||||||||||||||||||||||||||  |

| D-BIT | 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 | 120 | 121 | 122 | 123 | 124 | 125 | 126 | 127 |
|---|---|---|---|---|---|---|---|---|---|---|---|---|---|---|---|---|---|---|---|---|---|---|---|---|---|---|---|---|---|---|---|---|
| CB[0] | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| CB[1] | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| CB[2] | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| CB[3] | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| CB[4] | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 |
| CB[5] | 0 | 0 | 0 | 0 | 1 | 1 | 1 | 1 | 0 | 0 | 0 | 0 | 1 | 1 | 1 | 0 | 0 | 0 | 0 | 1 | 1 | 1 | 1 | 0 | 0 | 0 | 0 | 1 | 1 | 1 | 1 | 1 |
| CB[6] | 0 | 0 | 1 | 1 | 0 | 0 | 1 | 1 | 0 | 0 | 1 | 1 | 0 | 0 | 1 | 0 | 0 | 1 | 1 | 0 | 0 | 1 | 1 | 0 | 0 | 1 | 1 | 0 | 0 | 1 | 1 | 1 |
| CB[7] | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| QUADRANT | Q4 |||||||||||||||||||||||||||||||  |

FIG. 2B

BURST ORDER AND DQ MAP 400

| DATA BIT | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| x8 BURST ORDER | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 |
| x8 DQ MAP | DQ0 | | | | | | | | DQ1 | | | | | | | | DQ2 | | | | | | | | DQ3 | | | | | | | |
| x16 DQ MAP | DQ0, DQ8 | | | | | | | | DQ1, DQ9 | | | | | | | | DQ2, DQ10 | | | | | | | | DQ3, DQ11 | | | | | | | |
| x4 BURST ORDER | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| x4 DQ MAP | DQ0-N | | | | | | | | | | | | | | | | DQ1-N | | | | | | | | | | | | | | | |
| DATA BIT | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
| x8 BURST ORDER | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 |
| x8 DQ MAP | DQ4 | | | | | | | | DQ5 | | | | | | | | DQ6 | | | | | | | | DQ7 | | | | | | | |
| x16 DQ MAP | DQ4, DQ12 | | | | | | | | DQ5, DQ13 | | | | | | | | DQ6, DQ14 | | | | | | | | DQ7, DQ15 | | | | | | | |
| x4 BURST ORDER | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| x4 DQ MAP | DQ0-N+X | | | | | | | | | | | | | | | | DQ1-N+X | | | | | | | | | | | | | | | |
| DATA BIT | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 |
| x8 BURST ORDER | 8 | 9 | 10 | 11 | 12 | 13 | 14 | 15 | 8 | 9 | 10 | 11 | 12 | 13 | 14 | 15 | 8 | 9 | 10 | 11 | 12 | 13 | 14 | 15 | 8 | 9 | 10 | 11 | 12 | 13 | 14 | 15 |
| x8 DQ MAP | DQ0 | | | | | | | | DQ1 | | | | | | | | DQ2 | | | | | | | | DQ3 | | | | | | | |
| x16 DQ MAP | DQ0, DQ8 | | | | | | | | DQ1, DQ9 | | | | | | | | DQ2, DQ10 | | | | | | | | DQ3, DQ11 | | | | | | | |
| x4 BURST ORDER | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| x4 DQ MAP | DQ2-N | | | | | | | | | | | | | | | | DQ3-N | | | | | | | | | | | | | | | |
| DATA BIT | 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 | 120 | 121 | 122 | 123 | 124 | 125 | 126 | 127 |
| x8 BURST ORDER | 8 | 9 | 10 | 11 | 12 | 13 | 14 | 15 | 8 | 9 | 10 | 11 | 12 | 13 | 14 | 15 | 8 | 9 | 10 | 11 | 12 | 13 | 14 | 15 | 8 | 9 | 10 | 11 | 12 | 13 | 14 | 15 |
| x8 DQ MAP | DQ4 | | | | | | | | DQ5 | | | | | | | | DQ6 | | | | | | | | DQ7 | | | | | | | |
| x16 DQ MAP | DQ4, DQ12 | | | | | | | | DQ5, DQ13 | | | | | | | | DQ6, DQ14 | | | | | | | | DQ7, DQ15 | | | | | | | |
| x4 BURST ORDER | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| x4 DQ MAP | DQ2-N+X | | | | | | | | | | | | | | | | DQ3-N+X | | | | | | | | | | | | | | | |

TARGETED ALIASING SINGLE ERROR CORRECTION (SEC) CODE

PRIORITY

The present application is a nonprovisional application based on U.S. Provisional Patent Application No. 62/448,122, filed Jan. 19, 2017. This application claims the benefit of priority of that provisional application, and the provisional application is hereby incorporated by reference.

FIELD

The descriptions are generally related to memory error management, and more particular descriptions are related to error checking and correction in a memory subsystem with a memory device that performs internal error checking and correction.

BACKGROUND

Computing devices require storage for data and code to be executed. Temporary storage traditionally provides faster access to data for execution, and has traditionally been implemented with volatile memory resources. Volatile memory must be periodically refreshed to retain a determinative state, but its density and low access latency makes it a preferred technology for current computing platforms, whether for servers, desktop or laptop computers, mobile devices, and consumer and business electronics. DRAM (dynamic random access memory) devices are the most common types of volatile memory devices in use. Single bit DRAM failures are projected to increase as the manufacturing processes that produce DRAMs generate components with smaller geometries, leading to an increase in persistent single bit errors.

One technique for addressing the increasing error rate is with on-die ECC (error checking and correction), which refers to error detection and correction logic that resides on the memory device itself. In general, error checking and correction can vary from the lowest levels of protection (such as parity) to more complex algorithmic solutions (such as double-bit error correction). Parity error generation and checking is fast, and can indicate an error in a long string with a single parity bit, but it provides no correction capability. Single error correction (SEC) requires more resources than parity, and can correct a single error per code word. Double-bit error correction requires more resources (time and code store) to implement, which may not be feasible for on-die ECC in memory devices in high-speed, high-bandwidth applications. While stronger codes provide better error detection and correction, there is a tradeoff with computation time and resources that favors weaker codes in on-die ECC implementations.

In systems that employ DRAMs implementing on-die SEC, the ECC can correct a single bit error (SBE). On-die ECC can be used in addition to system level ECC, and the memory device may return single-error corrected data that is indistinguishable to the system from data that had no errors. However, an SEC ECC system can attempt to correct a double bit error as an SBE. The miscorrection of a double bit error (which system-level ECC may be able to correct) as an SBE can actually create a triple bit error by toggling a third bit due to misinterpreting the double bit error as an error at a bit indicated by an SEC code. While a double bit error may be correctable or detectable with system-level ECC, a triple bit error may not be correctable or detectable. Aliasing can refer to the erroneous changing of a bit value based on syndrome computation. Aliasing can create an additional error while attempting to correct an error. Traditional on-die ECC is subject to aliasing errors due to limitations on the resources needed to implement ECC.

BRIEF DESCRIPTION OF THE DRAWINGS

The following description includes discussion of figures having illustrations given by way of example of implementations of examples of the invention. The drawings should be understood by way of example, and not by way of limitation. As used herein, references to one or more "examples" are to be understood as describing a particular feature, structure, and/or characteristic included in at least one implementation of the invention. Thus, phrases such as "in one example" or "in an alternate example" appearing herein describe various examples and implementations of the invention, and do not necessarily all refer to the same example. However, they are also not necessarily mutually exclusive.

FIG. 2B is a diagrammatic representation of an example of a quadrant-based code matrix that prevents aliasing that causes errors in adjacent quadrants.

FIG. 4 is a diagrammatic representation of an example of burst order and data bit mapping for quadrant-based internal ECC.

Figure 1:
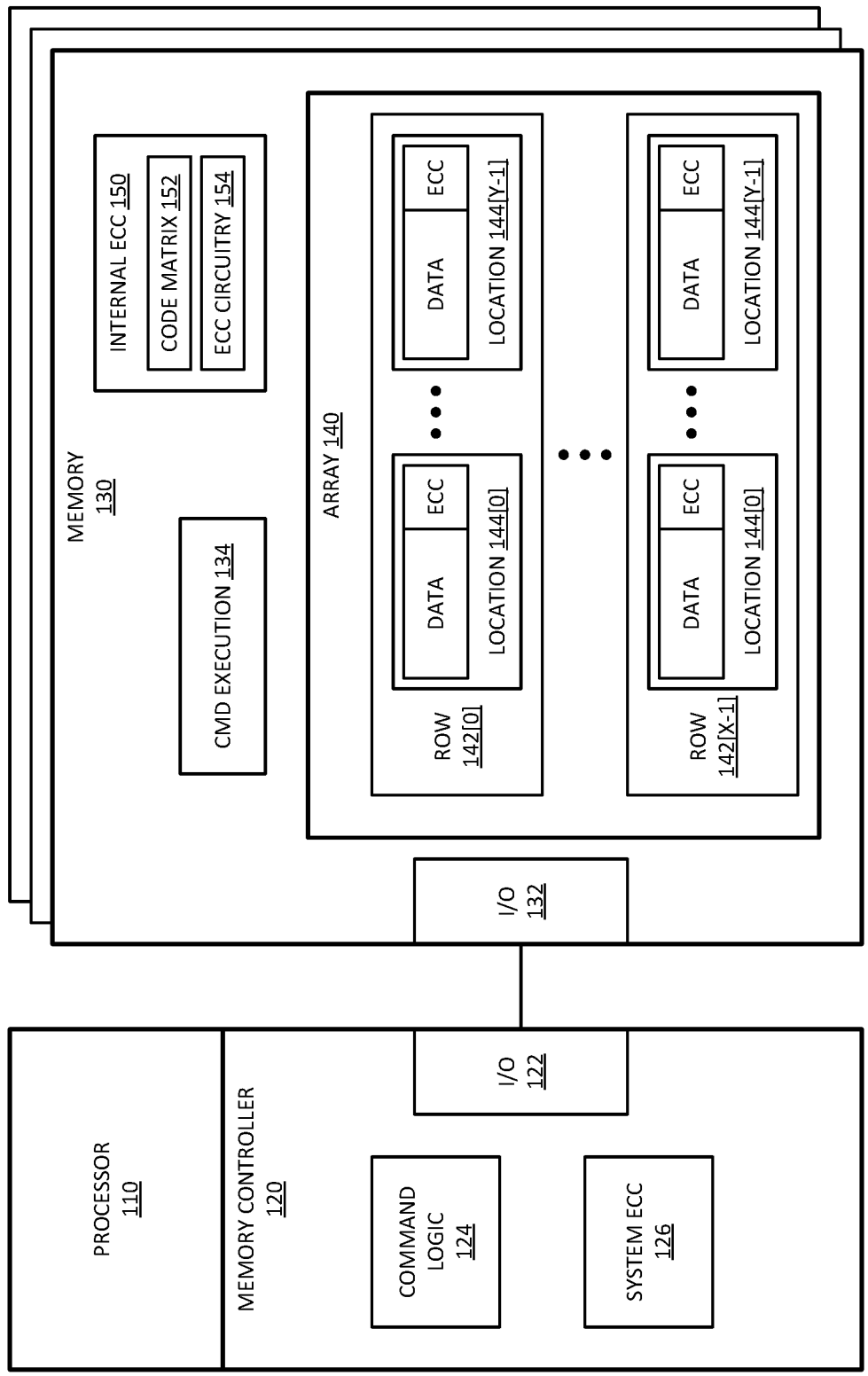
FIG. 1 is a block diagram of an example of a system with a memory device that performs internal error correction with a quadrant-based code matrix that prevents aliasing that causes errors in adjacent quadrants.

Descriptions of certain details and implementations follow, including a description of the figures, which may depict some or all of the examples described below, as well as discussing other potential examples or implementations of the inventive concepts presented herein.

DETAILED DESCRIPTION

As described herein, an on-memory application of error correction includes an error correction code based on different quadrants of the data word. A memory device is configured to provide internal or on-die ECC (error checking and correction or error correction coding). In such a system, the code matrix can be managed as four quadrants of (N/4) bits, with two adjacent quadrants in an (N/2)-bit segment or portion. The N codes of the matrix correspond to the N bits of a data word to be protected by the ECC. The memory device includes internal ECC circuitry to perform ECC in the DRAM device with the ECC bits and code matrix in response to a request to access the data word. The codes in a quadrant steer an aliased bit to a quadrant other than the adjacent quadrant.

Based on the codes in the different quadrants of the code matrix, double bit errors with one bit in each quadrant of a code word half will not alias to a triple bit error. Aliasing a bit error can refer to the ECC process of selecting a correct bit to invert in an ECC operation based on ECC computations. When the data includes two errors, the computations can lead to an error syndrome that points to a different bit, which would then be inverted or flipped in an expectation of correcting the error. However, with two errors, the computations can result in flipping a correct bit without correcting either of the incorrect bits. Thus, ECC operations can actually interpreting errors at two separate bit locations of a code word as an error at a different, third bit based on the error syndrome, and cause the ECC circuitry to create a triple bit error.

In one example, a system where a memory device performs on-die ECC operates on an N-bit data word as four quadrants of (N/4)-bits each. By separating the code into two segments of two quadrants each, the memory device can perform SBE correction on the whole word while checking for certain double bit errors that occur with errors in adjacent quadrants. The ECC performs computations based on a code matrix that includes N columns corresponding to the N bits of the data word and M columns corresponding to the M ECC bits.

Single error correction (SEC) codes can detect and correct single bit errors but will not correct double bit errors, and may miscorrect a double bit error into a triple bit error (aliased error). In some systems (e.g., a server system using ×8 DRAMs), a triple bit error in a DRAM can result in an uncorrectable error, or an undetectable error which may be worse, and corrupt data. A code can map any possible aliased triple bit errors to prevent undetectable errors at a server memory controller system.

In one example, an SEC code divides the data received in a ×8 DRAM read command into four equal quadrants. In one example, if a single bit error is present in the 1st quadrant and a single bit error is present in the 2nd quadrant, the SEC code will recognize that an uncorrectable multibit error is present in the data and will not alias a code word bit. Likewise, if a single bit error is present in the 3rd quadrant and a single bit error is present in the 4th quadrant, the SEC code will not alias a code word bit. Thus, the system will not cause a triple bit error from a double bit error in these cases.

Such a code or code matrix for on-die ECC protects double bit errors that are correctable by the memory controller from being aliased by on-die ECC into uncorrectable triple bit errors in ×8, and ×16 devices. Traditional SEC correction codes do not, in general, steer triple bit aliased errors.

FIG. 1 is a block diagram of an example of a system with a memory device that performs internal error correction with a quadrant-based code matrix that prevents aliasing that causes errors in adjacent quadrants. System 100 represents components of a memory subsystem. System 100 can be included in any type of computing device or electronic circuit that uses memory with internal ECC, where the internal ECC includes a code matrix to prevent aliasing a double bit error in such a way to create another error in an adjacent quadrant. In one example, the system aliases a double-bit error miscorrection to a portion of the code word that does not result in a triple bit error with errors in adjacent quadrants.

Processor 110 represents any type of processing logic or component that executes operations based on data stored in memory 130 or to store in memory 130. Processor 110 can be or include a host processor, central processing unit (CPU), microcontroller or microprocessor, graphics processor, peripheral processor, application specific processor, or other processor. Processor 110 can be or include a single core or multicore circuit. Memory controller 120 represents logic to interface with memory 130 and manage access to data of memory 130. As with the memory controller above, memory controller 120 can be separate from or part of processor 110. Processor 110 and memory controller 120 together can be considered a "host" from the perspective of memory 130, and memory 130 stores data for the host. In one example, memory 130 includes DRAMs that have internal ECC. In one example, system 100 includes multiple memory resources 130. Memory 130 can be implemented in system 100 in any type of architecture that supports access via memory controller 120 with use of internal ECC in the memory. Memory controller 120 includes I/O (input/output) 122, which includes hardware resources to interconnect with corresponding I/O 132 of memory 130.

Memory controller 120 includes command logic 124, which represents control logic within the host to issue commands to memory 130. The commands can include data access commands or control commands or a combination. Command logic 124 can send commands and data via I/O 122, and receive data from I/O 132. In one example, memory controller 120 includes system ECC logic 126, which represents logic within the host to perform ECC. System-level ECC 126 represents ECC that can use data from multiple parallel memory devices 130 to provide higher-level ECC. In one example, system ECC 126 can spread data across multiple parallel resources. By spreading data across multiple resources, memory controller 120 can recover data even in the event of one or more failures in memory resources 130. Memory errors are generally categorized as either soft errors, which are transient bit errors typically resulting from random environmental conditions, or hard errors, which are non-transient bit errors occurring as a result of a hardware failure or hard failures.

Memory 130 includes command execution 134, which represents control logic within the memory device to receive and execute commands from memory controller 120. The commands can trigger multiple ECC operations for the memory device to perform. In one example, memory 130 performs internal ECC independent of a specific ECC command or request from the host. For example, memory 130 can generate ECC check bits in response to a write command, and perform checking and correction in response to a read command.

Memory 130 includes array 140, which represents the array of memory locations where data is stored in the memory device. In one example, each address location 144 of array 140 includes associated user data and ECC bits. In one example, address locations 144 represent addressable chunks of data, such as 128-bit chunks, 64-bit chunks, or 256-bit chunks. In one example, address locations 144 are organized as segments or groups of memory locations. For example, as illustrated, memory 130 includes multiple rows 142. In one example, each row 142 is a segment or a portion of memory that is checked for errors. In one example, rows 142 correspond to memory pages or wordlines. Array 140 includes X rows 142, and rows 142 include Y memory locations 144 or Y columns. It will be understood that the organization of rows 142, locations 144, and data and ECC bits do not necessarily imply a physical layout of the bits in array 140, but illustrate one example of an understanding of the addressability of the data bits.

In one example, address locations 144 correspond to memory words, and rows 142 correspond to memory pages. A page of memory refers to a granular amount of memory space allocated for a memory access operation. In one example, array 140 has a larger page size to accommodate the ECC bits in addition to the data bits. Thus, a normal page size would include enough space allocated for the data bits, and array 140 allocates enough space for the data bits plus the ECC bits.

In one example, memory 130 includes internal ECC logic 150. Internal ECC 150 includes circuitry 154 to perform error checking and correction in accordance with what is described herein. ECC circuitry 154 can include XOR circuits to generate check bits from input data words, and generate syndromes from fetched data words and corresponding ECC check bits. Internal ECC 150 includes code matrix 152, which can be or include an ECC H matrix. A code matrix refers to matrix having a length of a data word to be checked for errors, where each code is a column of size equal to a number of check bits for the type of ECC coding. For example, a code matrix for (128,136) Hamming has 128 rows of 8-bit codes.

Consider the length of the data words of locations 144 to be N bits. Thus, system 100 can be said to have array 140 that stores N-bit data words, and ECC bits associated with the data words. Code matrix 152 can represents a code store within memory 130 where the codes for ECC are stored. The code store can include one or more reserved memory locations 144, or other storage dedicated for the code matrix. Code matrix 152 includes N columns, which correspond to the N bits of the data words. In one example, the ECC circuitry checks and corrects errors based on quadrants of N/4 columns each, with the code matrix managed as four quadrants corresponding to four portions of the data word. In one example, the checking and correction based on quadrants can also include operation based on two segments or portions of N/2 bits each, with corresponding (N/2)-bit code portions. In one example, ECC circuitry 154 performs internal ECC based on the code word (the data word) and the associated ECC bits. Based on a check value or syndrome generated from an ECC computation on the data word and ECC bits, internal ECC 150 can identify a column of code matrix 152 to determine which bit of the data word to correct, or identifies a syndrome that is not in columns of the code matrix 152 to determine there is an error, but does not correct the error.

In one example, performance of the ECC steers error correction to generate an aliased error in a quadrant that is not an adjacent quadrant. For example, if Q1 and Q2 represent adjacent quadrants, an error in Q1 can result in aliasing in Q1, Q3, and Q4, but not in adjacent quadrant Q2. As such, the system can preserve the error correction and detection for system level control, even if the error is not corrected. In one example, system ECC 126 includes a test mode for testing code matrix 152. For example, system ECC 126 can perform certain ECC operations if code matrix 152 is a code matrix as described herein that prevents aliasing that causes errors in adjacent quadrants.

Figure 2A:
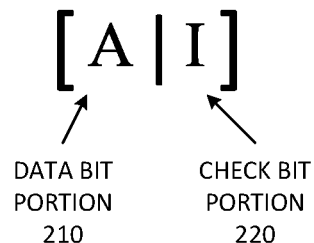
FIG. 2A is a representation of an example of code operations with a quadrant-based code matrix that prevents aliasing that causes errors in adjacent quadrants.

FIG. 2A is a representation of an example of code operations with a quadrant-based code matrix that prevents aliasing that causes errors in adjacent quadrants. H matrix 202 represents a layout of a full H matrix with data bit portion 210, and check bit portion 220. Details of data bit portion 210 are illustrated below in FIG. 2B as H-matrix 210. The data portion include columns corresponding to the right half of the check bit equations. Check bit portion 220 is invertible, and each column of the matrix is unique.

One example of check bit portion 220 includes one bits on the diagonal of the check bit matrix, and otherwise is zeros. Thus, the check bit matrix can include CB0='10000000', CB1='01000000', CB2='00100000', CB3='00010000', CB4='00001000', CB5='00000100', CB6='00000010', and CB7='00000001'. It will be observed in the example that the check bit byte has a one bit in the bit position that matches the number of the check bit. For example, CB0 has a one in bit position 0, CB1 has a one in bit position 1, CB2 has a one in bit position 2, and so forth. It will be understood that matrix 220 provides just one example, and other implementations are possible.

FIG. 2B is a diagrammatic representation of an example of a quadrant-based code matrix that prevents aliasing that causes errors in adjacent quadrants. H-matrix 210 represents one example of a code that steers triple bit errors. H matrix 210 includes four quadrants: Q1, Q2, Q3, and Q4, and a check bit portion. As illustrated in matrix 210, the data bits are partitioned into equal halves, and both halves are partitioned into equal quadrants. The quadrants that form a half are adjacent to each other, and not adjacent to either quadrant of the other half. Thus, Q1 and Q2 are adjacent to each other, and Q3 and Q4 are adjacent to each other, but Q1 is not adjacent to either Q3 or Q4, and Q2 is not adjacent to either Q3 or Q4. The on-die ECC uses the code to generate ECC check bits for write transactions, and checks data for read transactions. H-matrix 210 provides a specific example of a combination of ones and zeros for a code matrix that prevents aliasing an error to an adjacent quadrant, and will be understood as only one example of code matrices with the properties described herein.

In one example, a DRAM will use 128 data bits to compute 8 ECC check bits or code bits (CB[7:0]) defined by the ECC code. For the purpose of describing the ECC code represented by H-matrix 210, the 128 data bits are divided into four equal quarters: a top 64 bits [63:0] includes Q1 and Q2 (with [31:0] and [63:32], respectively), and a bottom 64 bits [127:64] includes Q3 and Q4 (with [127:96] and [95:64], respectively). It will be understood that for the 128 bits, N=128, and the "top half" having Q1 and Q2 includes two quadrants with N/4 bits each (32 bits) for a total of N/2 bits in that portion (64 bits). Likewise the "bottom half" having Q3 and Q4 includes two quadrants with N/4 bits each (32 bits) for a total of N/2 bits in that portion (64 bits).

The following provides certain examples. The examples reference interface widths, such as ×4 or ×8, referring to a number of bits of a data bus interface. For a ×4 DDR5 device, internal prefetch for on-die ECC is 128 bits even though a ×4 has an external transfer size of 64 bits. For each read or write transaction in a x4 device, an additional section of the DRAM array is accessed internally to provide the required additional 64 bits used in the 128 bit ECC computation. In other words, in an x4 device, each 8 bit ECC check bit word is tied to two 64 bit sections of the DRAM. In the case of a x8 device, no extra prefetch is required, as the prefetch is the same as the external transfer size. For an x16 device, two 128 bit data words and their corresponding 8 check bits are fetched from different banks. Each 128 data bits and the corresponding 8 check bits are checked separately and in parallel.

In one example, on reads the DRAM corrects any single bit errors before returning the data to the memory controller. The DRAM will not write the corrected data back to the array during a read cycle. For double bit errors, an ECC code may generally be capable of miscorrecting (or miss-correcting) a double bit error into a triple bit error. The code of H matrix 210 restricts the double bit error cases allowed to miscorrect a data bit. Thus, H matrix 210 includes an example of a code that will not miscorrect a data bit if a double bit error occurs with one bit in Q1 and the other bit in Q2, likewise the code will not miscorrect any data bit if the double bit error occurs with one error bit in Q3 and one error bit in Q4. The code may alias into a triple bit if another double bit error combination occurs, but the above rules constrain the location of the miscorrection in such a way that the aliased bit will not cause errors in adjacent quadrants, such as in both Q1 and Q2, or in both Q3 and Q4.

In one example, ECC circuitry can utilize H-matrix 210 to perform SEC to correct a single bit error in the top portion or in the bottom portion. As presented, H-matrix 210 includes coding that will not alias a bit to an adjacent quadrant. In one example, detection of errors in adjacent quadrants will cause the ECC circuitry to not alias a data bit.

For a double error in a single quadrant, to ensure that a double bit error does not alias to the adjacent quadrant, a bitwise XOR of any two columns in a quadrant should not alias to a code in the adjacent quadrant. For example, consider a bitwise XOR of columns 11 and 12 in Q1: 00111011 XOR 00111100 equals '00000111', which is not a column found in Q2. In fact, that code is not found in H-matrix 210. Consider another example of a bitwise XOR of columns 15 and 16 in Q1: 00111111 XOR 10010000 equals 10101111, which is not a column found in Q2. That code exists in H-matrix 210 in column 127 of Q4, which is not adjacent to Q1. Similarly, a bitwise XOR of columns 47 and 48 of Q2 results in: 10111111 XOR 11010000 equals 01101111, which is not a column found in Q1. That codes exists in column 111 of Q4. Any other example in matrix 210 is possible, and not just for adjacent columns. Consider an example of columns 76 and 86 of Q3: 01101100 XOR 01010110 equals 00111010, which is column 10 of Q1, which is not in Q4, and therefore not adjacent to Q3.

Figure 3:
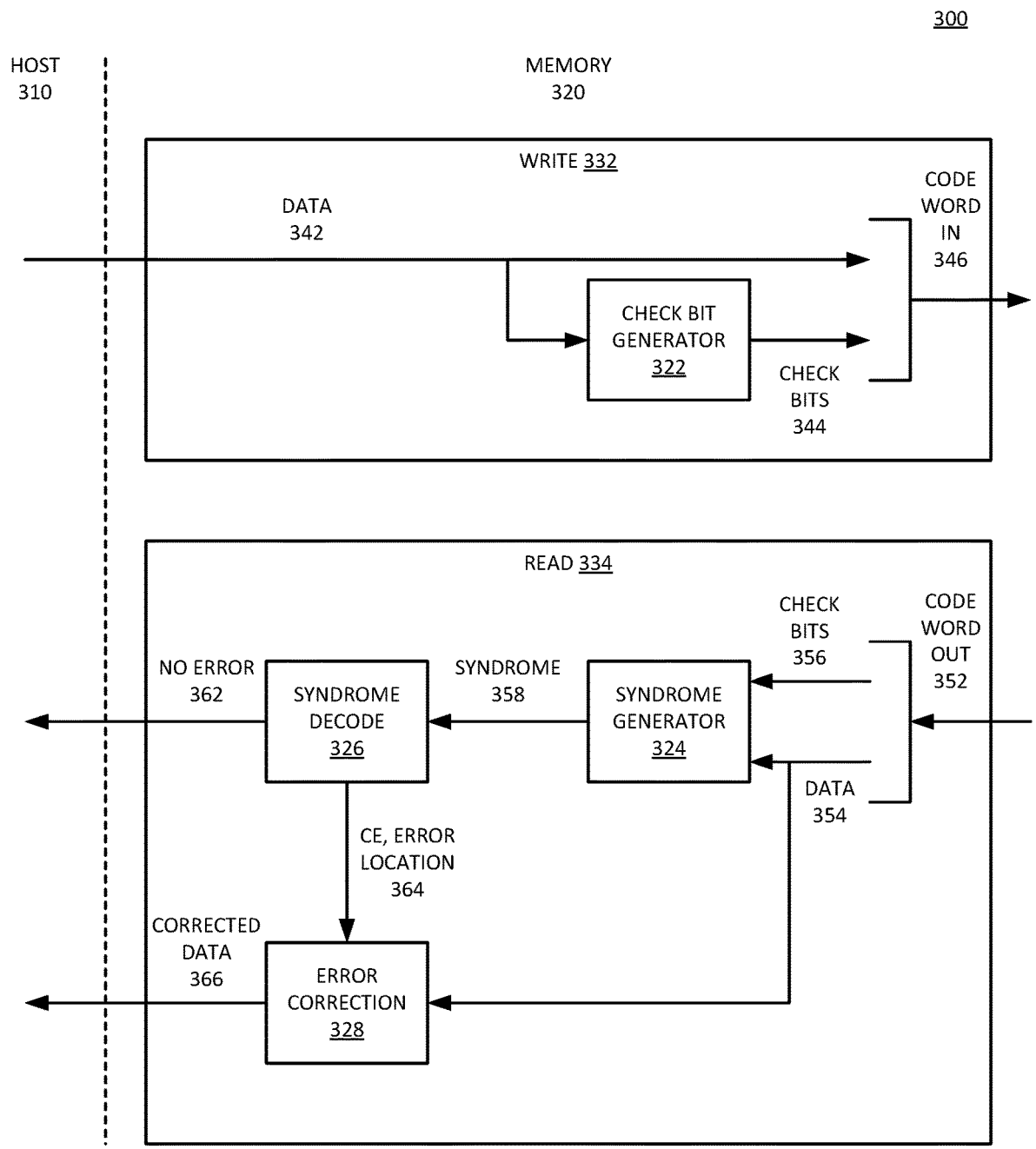
FIG. 3 is a block diagram of an example of ECC logic at a memory device that performs internal ECC in accordance with a quadrant-based code matrix.

FIG. 3 is a block diagram of an example of ECC logic at a memory device that performs internal ECC in accordance with a quadrant-based code matrix. System 300 is one example of ECC component operation for a memory subsystem with a memory device having internal ECC that applies a code matrix that prevents aliasing to cause an error in an adjacent quadrant, in accordance with an example described herein. In one example, two bit errors in the same half may be aliased if they are in a single quadrant. System 300 provides an example of internal ECC in a DRAM, which generates and stores internal check bits. Host 310 includes a memory controller or equivalent or alternative circuit or component that manages access to memory 320, and can be integrated on a processor chip (e.g., iMC). Host 310 performs external ECC on data read from memory 320.

System 300 illustrates write path 332 in memory 320, which represents a path for data written from host 310 to memory 320. Host 310 provides data 342 to memory 320 for writing to the memory array(s). In one example, memory 320 generates check bits 344 with check bit generator 322 to store with the data in memory, which can be one example of internal ECC bits used for code word checking/correction. Check bits 344 can enable memory 320 to correct an error that might occur in the writing to and reading from the memory array(s). Data 342 and check bits 344 can be included as code word in 346, which is written to the memory resources. It will be understood that check bits 344 represent internal check bits within the memory device. In one example, there is no write path to check bits 344. In one example, there is a write path to check bits 344 only for purposes of testing the code matrix of memory 320.

Read path 334 represents a path for data read from memory 320 to host 310. In one example, at least certain hardware components of write path 332 and read path 334 are the same hardware. In one example, memory 320 fetches code word out 352 in response to a Read command from host 310. The code word can include data 354 and check bits 356. Data 354 and check bits 356 can correspond, respectively, to data 342 and check bits 344 written in write path 332, if the address location bits of the write and read commands are the same. It will be understood that error correction in read path 334 can include the application of an XOR (exclusive OR) tree to a corresponding H matrix to detect errors and selectively correct errors (in the case of a single bit error).

As is understood in the art, an H matrix refers to a hamming code parity-check matrix that shows how linear combinations of digits of the code word equal zero. In one example, the ECC includes XORing ECC check bits with an identical version generated as the syndrome, which results in zeros. Thus, the H matrix rows can identify the coefficients of parity check equations that must be satisfied for a component or digit to be part of a code word. In one example, memory 320 includes syndrome generator 324 to generate an error vector or syndrome. In one example, check bit generator 322 and syndrome generator 324 are fully specified by a corresponding H matrix for the memory device. The H-matrix for system 300 can be in accordance with the form of H-matrix 210 of FIG. 2, with steering of the aliased bit to prevent aliasing to the adjacent quadrant.

In one example, syndrome generator 324 passes syndrome 358 to syndrome decode 326, which enables the memory to apply check bits 356 to data 354 to detect errors in the read data. Syndrome decode 326 can check syndrome 358 against an ECC code vector or code matrix in accordance with any example described herein. Data 354 can also be forwarded to error correction 328 for correction of a detected error.

In one example, if there are no errors in the read data (e.g., zero syndrome 358), syndrome decode 326 can pass the data to host 310 as no error 362. In one example, if there is a single bit error (e.g., non-zero syndrome 358 that matches one of the columns of the H matrix), syndrome decode 326 can generate a CE (corrected error) signal with error location 364, which is a corrected error indication to error correction logic 328. Error correction 328 can apply the corrected error to the specified location in data 354 to generate corrected data 366 for writing to host 310.

In one example, syndrome decode 326 applies separate functions for the following conditions. In the case of a zero syndrome, syndrome decode 326 can pass no error data 362 to host 310. In the case of a non-zero syndrome that matches one of the columns of the H matrix, the ECC engine can flip or toggle the corresponding bit to create a corrected error signal (CE). Error correction 328 can perform the actual data correction by changing the identified bit 364. In one example, in the case of a non-zero syndrome that does not match any column, syndrome decode sends the erroneous data to host 310. Corrected data 366 sent from error correction logic 328 is sent when a corresponding column is found in the matrix. In one example, syndrome decode 326 identifies data as detected, uncorrected error (DUE).

FIG. 4 is a diagrammatic representation of an example of burst order and data bit mapping for quadrant-based internal ECC. Burst order and DQ (data) map 400 illustrates an example of a mapping of a code word in accordance with an example of an I/O interface of a memory device that performs internal ECC and utilizes a code matrix in accordance with what is described herein. Map 400 illustrates the I/O mapping for devices of different interface types, whereas the mapping of the H-matrix code 210 in FIG. 2 illustrates the mapping of codes to data bits.

In map 400, the mapping illustrates x8 burst order for a x8 DQ interface, which corresponds with a x8 DQ map. Map 400 also illustrates a x4 burst order for a x4 DQ interface, corresponding to a x4 DQ map. Map 400 illustrates a x16 DQ map. Actual implementations in DRAMs may use a different H-matrix or different mappings, or both, as long as the structure of the H-matrix adheres to the rules described herein, and the mappings are compatible with the application of ECC with such a code matrix.

In one example, for a x8 device, the top code word half is mapped to the first half of the 16 UI (unit interval) burst and the bottom code word half is mapped to the last half of the burst. In one example, for a x16 device, the device will read out two 128 bit code words and the x8 mapping will be applied to each of the code words. One code word can be mapped to DQ[0:7] and the other to DQ[8:15]. In one example, a x4 device has the 128 bit code word divided into two 64 bit column accesses (N, N+X). In one example, the 64 bit code word including Q1 and Q3 is mapped to access N, and the 64 bit code word including Q2 and Q4 is mapped to access N+X.

In one example, on writes, a DRAM computes ECC and writes data and ECC bits to the array. If the external data transfer size is smaller than the 128 bit code word (e.g., for x4 devices), the DRAM can perform an internal read-modify-write (RMW) operation. In one example, the DRAM will correct any single bit errors that result from the internal read before merging the incoming write data, re-computing the ECC Check bits before writing data and ECC bits to the array. The ECC blocks represent the ECC check bit generator, syndrome generator, syndrome decode and correction. The check bit generator and syndrome generator blocks are fully specified by the H matrix.

In accordance with an example of map 400, for a x4 data interface, each of the N codes of the H-matrix is to provide ECC information for accesses of four separate (N/4)-bit columns of data. In accordance with an example of map 400, for a x8 data interface each of the N codes of the H-matrix is to provide ECC information for accesses of two separate (N/2)-bit columns of data. In accordance with an example of map 400, for a x16 data interface, each of the N codes is to provide ECC information for accesses of two separate (N/2)-bit columns, the two separate columns of data from two separate bank groups.

Figure 5:
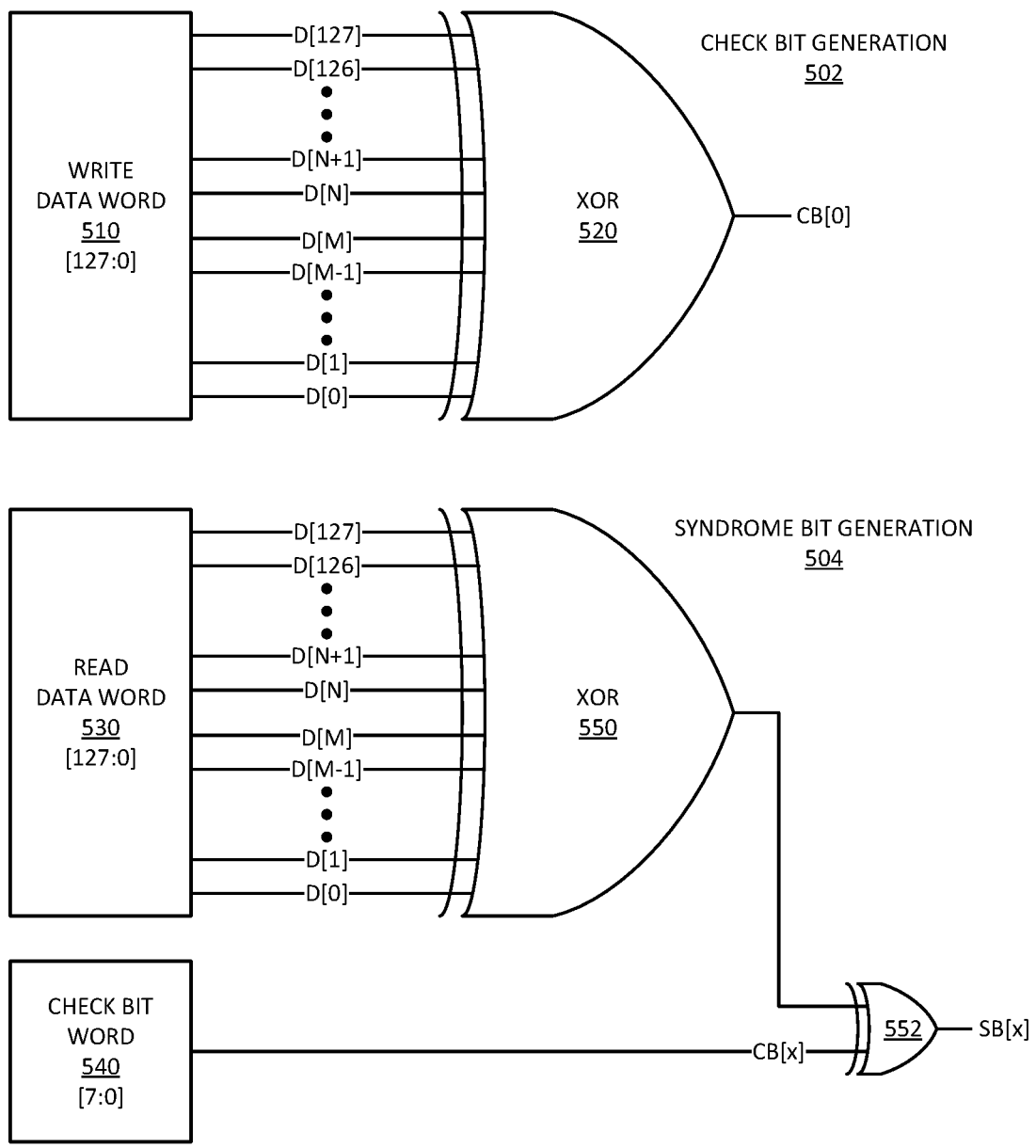
FIG. 5 is a block diagram of an example of check bit generation logic and syndrome bit generation logic.

FIG. 5 is a block diagram of an example of check bit generation logic and syndrome bit generation logic. The check bit and syndrome bit generation logics can be used in an example of an ECC engine that uses a quadrant-based code matrix that maps potential third bit errors resulting from miscorrection of two bits errors away from the portion of the code word of the specific quadrants where the two bit error was detected. Check bit generation logic 502 represents logic to perform ECC operations to generate a check bit. Syndrome bit generation logic 504 represents logic to perform ECC operations to generate a syndrome bit to compare against the check bit. For purposes of illustration in the drawing, the illustrated logic provides an example for a check bit CB[x] and corresponding syndrome bit SB[x]. In one example, various data bits, but not necessarily all data bits, are selectively XORed together to generate the check bit, and on the reverse side to generate the syndrome bit. It will be understood that other data bit mappings can be used.

It will be understood that as a technical matter, a true XOR operation can only exist for two inputs, where an output is one if and only if only one of the inputs is one. However, it is common convention to represent a cascade of XOR operations as a multi-input XOR (meaning a number of inputs greater than 2), such as XOR 520 and XOR 550. The XOR operation has a commutative property, and the XORing of multiple pairs of inputs, and then the series XORing of the outputs of those operations can be interchanged in any order with the same result. Thus, XOR 520 and XOR 550 have the practical effect of modulo 2 addition, which is also equivalent to odd parity detection. Odd parity detection provides a '1' as the output when there is an odd number of ones among the inputs, and an output zero when there is an even number of ones among the inputs.

For check bit generation 502, in one example the ECC engine receives write data word 510 (D[127:0]) from the host. In one example, XOR 520 receives as inputs D[127:N] and D[M:0]. Again, it will be understood that different data bit combinations can be used. Different bit combinations can be used for different check bits (e.g., CB[1], CB[2], . . . ). The combination is preconfigured to ensure that the same operations are performed each time to obtain consistent results. One example for check bit[0] can be represented as follows: CB[0]=D[127]^ D[126] ^ . . . ^ D[67]^ D[66]^ D[10]^ D[9] ^ . . . ^ D[1]^ D[0], where the operator '^' represents an XOR operation.

In one example, for syndrome bit generation 504, the ECC engine receives write data word 530 (D[127:0]) from the memory array. The ECC engine also receives check bit word 540 (CB[7:0]). In one example, XOR 550 receives as inputs D[127:N] and D[M:0] and CB[x]. Again, it will be understood that different data bit combinations can be used, but that syndrome generation will perform the same operation as check bit generation for a corresponding check bit. Thus, as illustrated, syndrome bit generation 504 performs the same operations to generate SB[x] as check bit generation 502 performs to generate CB[x]. The difference with syndrome bit generation 504 is that the ECC engine also XORs the corresponding check bit (in this example, CB[0]) to determine if there is a difference. One example for syndrome bit[0] can thus be represented as follows: SB[0] =D[127]^ D[126] ^ . . . ^ D[67]^ D[66]^ D[10]^ D[9] ^ . . . ^ D[1]^ D[0]^ CB[0], where the operator '^' represents an XOR operation.

While CB[x] can be represented as another input of XOR 550, for purposes of illustrating that the basic XOR operations are the same between check bit generation 502 and syndrome bit generation 504, and that the syndrome generation further includes the check bit operand, syndrome bit generation also includes XOR 552 cascaded with XOR 550. It will be understood that the end result of syndrome bit generation 504 will be a zero output (or zero syndrome) if the stored data bits are unchanged or uncorrupted from the received data bits (or read data word 530 matches write data word 510). It will be understood that some combination of check bits and syndrome bits should test all data word bits to ensure that no bits are corrupted. If read data word 530 is identical to write data word 510, XOR 550 will produce the same output as XOR 520, which will match the value of CB[x]. Thus, the output of XOR 552 will be zero if the data is not corrupted, and will be one only if there is an error.

Figure 6A:
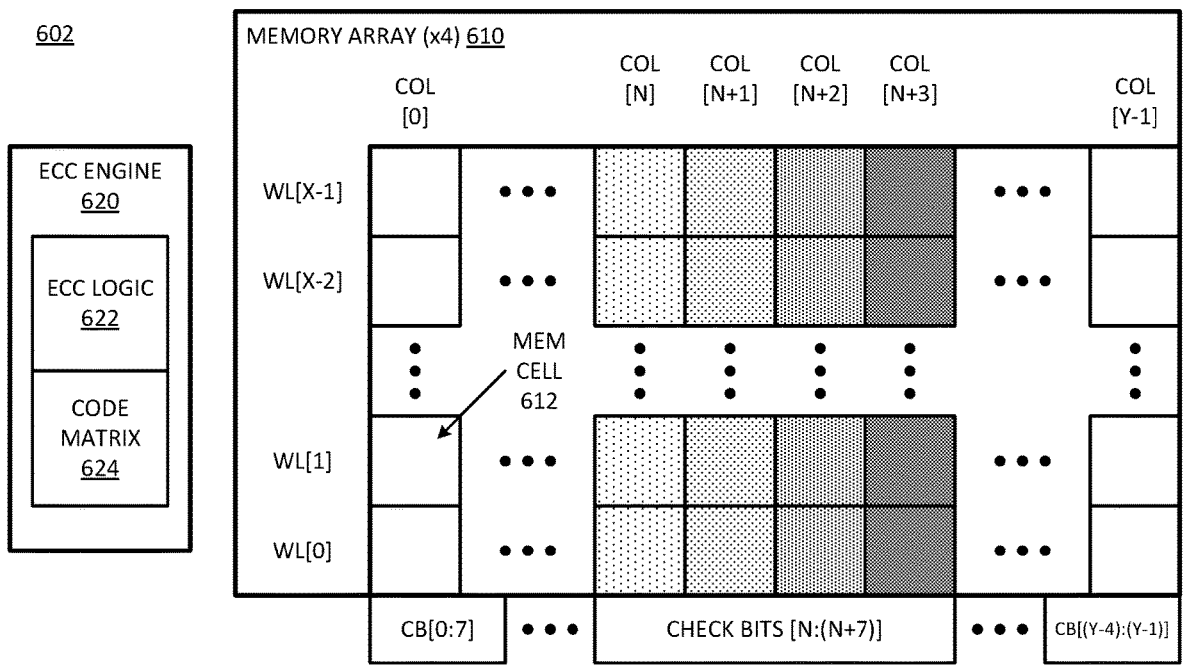
FIG. 6A is a block diagram of an example of a memory device having a 4 bit interface that performs internal ECC.

FIG. 6A is a block diagram of an example of a memory device having a 4 bit interface that performs internal ECC. Memory device 602 represents one example of an example of memory 130 of FIG. 1. Memory device 602 represents a ×4 memory device. Memory device 602 includes memory array 610, which can include X wordlines (WL) and Y columns (COL). Thus, each wordline has a width of Y memory cells 612, and each column has a height of X memory cells 612. It will be understood that while not specifically shown, memory array 610 includes wordline drivers, bitline drivers, sensing circuits, holding capacitors, switches, or other circuitry to read or write individual memory cells 612.

Memory device 602 includes ECC engine 620, which represents internal ECC for the memory device. ECC engine 620 includes ECC logic or circuitry 622 to perform ECC computations in memory device 602. ECC engine 620 includes or accesses code matrix 624 (which is stored in a code store of memory device 602). In one example, code matrix 624 aliases third bit errors due to error correction of double bit errors from a quadrant with an error to a quadrant that is not adjacent to the quadrant with the error, in accordance with any example described herein.

In one example, for a ×4 device, a single complete code word is four column accesses. Memory array 610 is illustrated in a way to represent the relationship between column accesses and code words or data words for purposes of ECC. Thus, check bits can correspond to multiple columns of memory array 610. As a result, each check bit word can apply to multiple columns of data (e.g., four). The codes in a code matrix can provide correction information across multiple columns.

For example, a first code bit word will include check bits that apply to columns [0:3]. Thus, memory array 610 has a code word divided into four column accesses: N, N+1, N+2, and N+3. In one example, the top code word half is mapped to the N and N+1 column accesses, and the bottom code word half is mapped to the N+2 and N+3 column accesses. Check bits [N:(N+3)] represent the check bits for that code word. In one example, check bits are stored in check bits wordlines at the bottom of the columns, but such a configuration is only one example, and the check bits can be stored in other locations within memory array 610.

In one example, ECC logic 622 performs operations on the code word with columns N and N+1 corresponding to a top half of code matrix 624 and with columns N+2 and N+3 corresponding to a bottom half of code matrix 624, where each column corresponds to a separate quadrant. Code matrix 624 includes codes that, with such a mapping, will cause bit errors occurring in N to not be aliased to N+1, an error occurring in N+1 to not be aliased to N, bit errors occurring in N+2 to not be aliased to N+3, and bit errors occurring in N+3 to not be aliased to N+2.

Figure 6B:
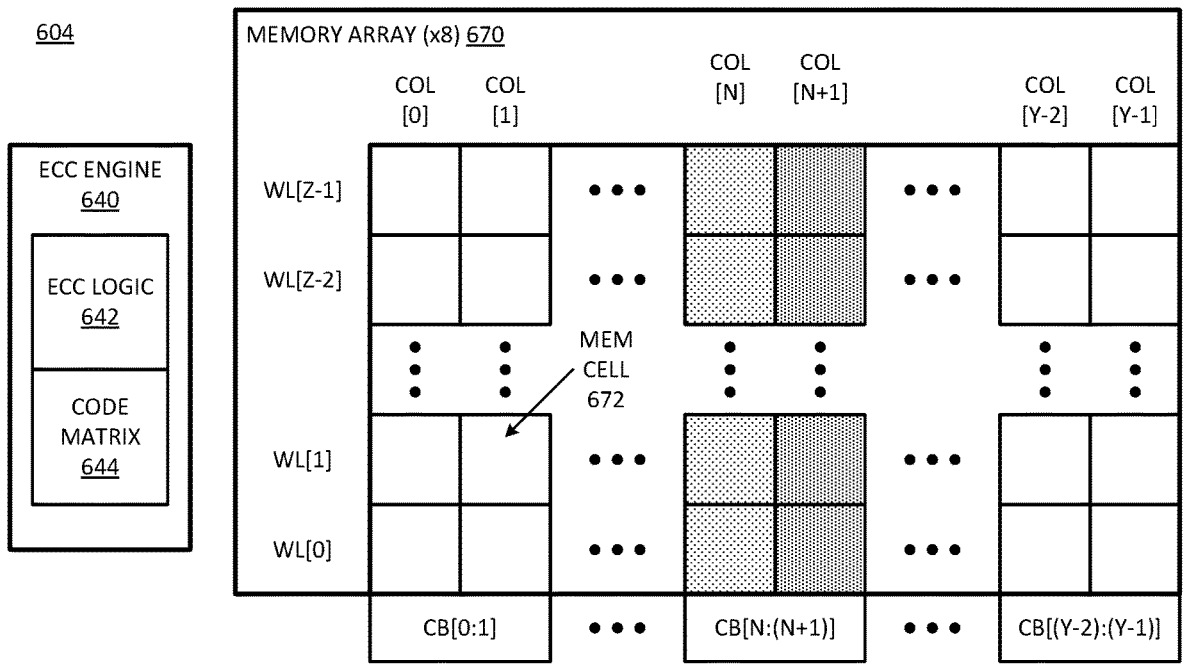
FIG. 6B is a block diagram of an example of a memory device having an 8 bit interface that performs internal ECC.

FIG. 6B is a block diagram of an example of a memory device having an 8 bit interface that performs internal ECC. Memory device 604 represents one example of an example of memory 130 of FIG. 1. Memory device 604 represents a ×8 memory device. Memory device 604 includes memory array 630, which can include Z wordlines (WL) and Y columns (COL). Thus, each wordline has a width of Y memory cells 632, and each column has a height of R memory cells 632. It will be understood that while not specifically shown, memory array 630 includes wordline drivers, bitline drivers, sensing circuits, holding capacitors, switches, and/or other circuitry to read and/or write individual memory cells 632. In one example, the Y columns of memory array 630 are a different number of columns from the Y columns of memory array 610 of memory device 602. In one example, the number of wordlines Z in memory array 630 is different from the number X of wordlines of memory array 610 of memory device 602. In one example, the number of wordlines Z in memory array 630 is the same as the number X of wordlines of memory array 610 of memory device 602.

Memory device 604 includes ECC engine 640, which represents internal ECC for the memory device. ECC engine 640 includes ECC logic or circuitry 642 to perform ECC computations in memory device 604. ECC engine 640 includes or accesses code matrix 644 (which is stored in a code store of memory device 604). In one example, code matrix 644 aliases third bit errors due to error correction of double bit errors from a quadrant with an error to a quadrant that is not adjacent to the quadrant with the error, which can for example, be the same quadrant, in accordance with any example described herein.

In one example, for a ×8 device, a single complete code word is two column accesses. Memory array 630 is illustrated in a way to represent that relationship between column accesses and code words or data words for purposes of ECC. Thus, check bits can correspond to multiple columns of memory array 630. As a result, each check bit word can apply to multiple columns of data (e.g., two). The codes in a code matrix can provide correction information across multiple columns.

For example, a first code bit word will include check bits that apply to columns [0:1]. Thus, memory array 630 has a code word divided into two column accesses: N and N+1. In one example, the top code word half is mapped to the N column access and the bottom code word half is mapped to the N+1 column access. Check bits [N:(N+1)] represent the check bits for that code word. In one example, check bits are stored in check bits wordlines at the bottom of the columns, but such a configuration is only one example, and the check bits can be stored in other locations within memory array 630.

In one example, ECC logic 642 performs operations on the code word with column N corresponding to a top half of code matrix 644 and with column N+1 corresponding to a bottom half of code matrix 644. Column N and column N+1 can both be organized as two quadrants each. Code matrix 644 includes codes that, with such a mapping, will cause bit errors occurring in N to not be aliased to the other quadrant in N, or an error occurring in N+1 to not be aliased to the other quadrant of N+1.

Figure 6C:
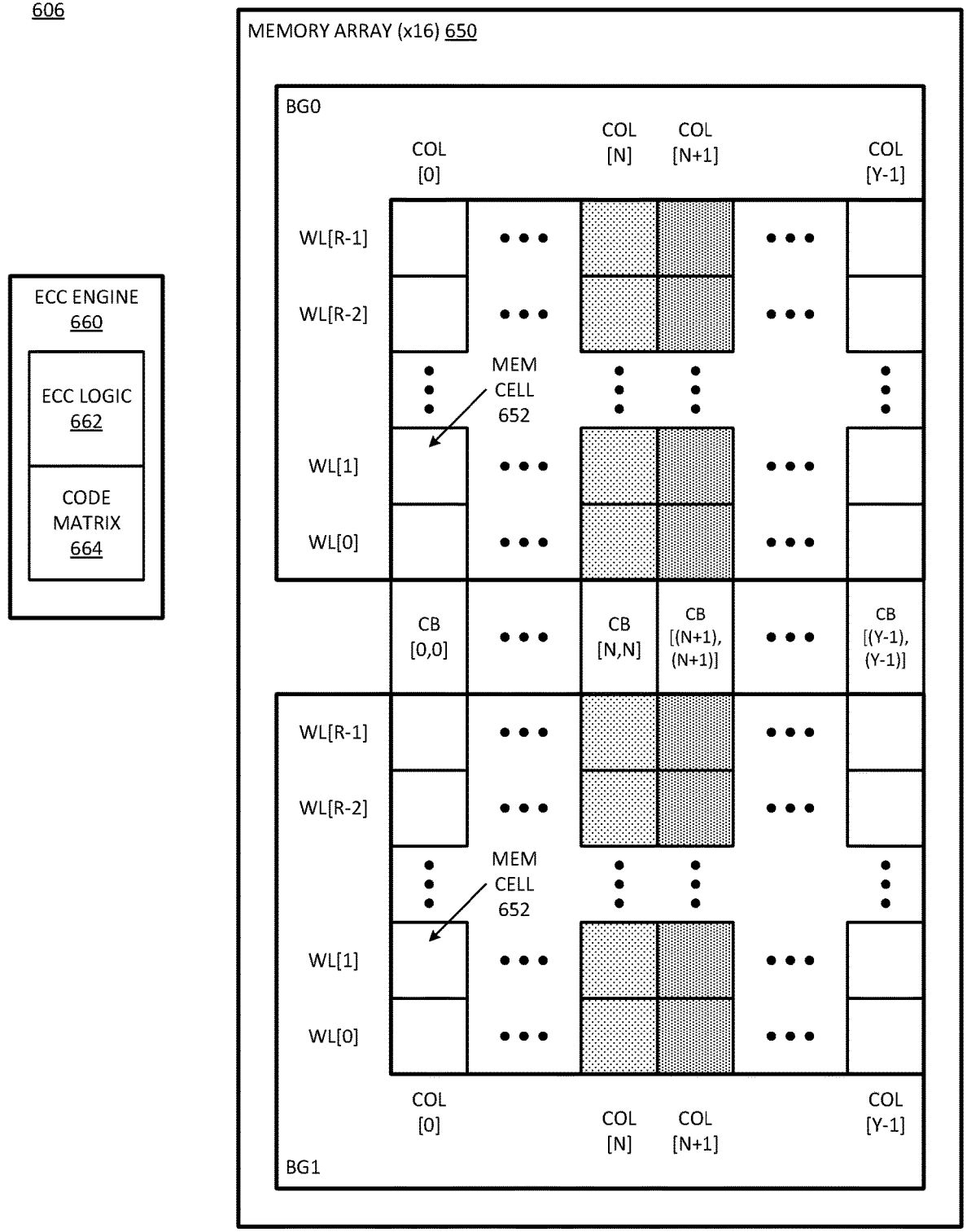
FIG. 6C is a block diagram of an example of a memory device having a 16 bit interface that performs internal ECC.

FIG. 6C is a block diagram of an example of a memory device having a 16 bit interface that performs internal ECC. Memory device 606 represents one example of an example of memory 130 of FIG. 1. Memory device 606 represents a ×16 memory device. Memory device 606 includes memory array 650, which can include R wordlines (WL) and Y columns (COL). Thus, each wordline has a width of Y memory cells 652, and each column has a height of R memory cells 652. It will be understood that while not specifically shown, memory array 650 includes wordline drivers, bitline drivers, sensing circuits, holding capacitors, switches, or other circuitry to read or write individual memory cells 652. In one example, the Y columns of memory array 650 are a different number of columns from the Y columns of memory array 610 of memory device 602 or memory array 630 of device 604. In one example, the number of wordlines R in memory array 650 is different from the number X of wordlines of memory array 610 of memory device 602 and/or from the number Z of wordlines of memory array 630. In one example, the number of wordlines R in memory array 650 is the same as the number X of wordlines of memory array 610 of memory device 602 or the same as the number Z of wordlines of memory array 630.

Memory device 606 includes ECC engine 660, which represents internal ECC for the memory device. ECC engine 660 includes ECC logic or circuitry 662 to perform ECC computations in memory device 606. ECC engine 660 includes or accesses code matrix 664 (which is stored in a code store of memory device 606). In one example, code matrix 664 aliases third bit errors due to error correction of double bit errors from a quadrant with an error to a quadrant that is not adjacent to the quadrant with the error, which can for example, be the same quadrant, in accordance with any example described herein.

In one example, for a ×16 device, a single complete code word is single column access. Memory array 650 is illustrated in a way to represent that relationship between column accesses and code words or data words for purposes of ECC. In one example, check bits can correspond to multiple columns of memory array 650, but from different bank groups BG0 and BG1. For example, a first code bit word will include check bits that apply to column [0] of both BG0 and BG1. Thus, memory array 650 has a code word from a single column access: column N from BG0 and column N from BG1. In one example, the top code word half is mapped to the column access from BG0 and the bottom code word half is mapped to the column access from BG1. Check bits [N,N] represent the check bits for the code word. In one example, check bits are stored in check bit wordlines at the bottom of the columns, but such a configuration is only one example, and the check bits can be stored in other locations within memory array 650.

In one example, ECC logic 662 performs operations on the code word with column N of BG0 corresponding to a top half of code matrix 664 and with column N of BG1 corresponding to a bottom half of code matrix 664. The code matrix for the bits of the columns can be organized as two quadrants each. Code matrix 664 includes codes that, with such a mapping, will cause bit errors occurring in one half to not be aliased to the other quadrant in the one half. In one example, each of N codes in code matrix 664 provides ECC information for accesses of two separate (N/2)-bit columns from separate bank groups. Alternatively it can be considered to be an access for a single N-bit column, but from separate groups. In one example, ECC engine 660 performs ECC on two segments from separate prefetches, and transmits data to the host from only a one selected segment.

In general, regarding memory devices 602, 604, and 606, in one example, a ×4 or a ×8 DRAM device, the internal prefetch is 128 bits even though the ×8 device has a 64 bit prefetch device and the ×4 device has a 32 bit prefetch. For each read or write transaction in a ×8 device, two columns of the memory array are accessed internally to provide the required additional 64 bits used in the 128 bit ECC computation. Thus, in a ×8 device, each 8 bit ECC check bit word is tied to two 64 bit sections of memory array. In the case of the ×4 device, in one example, each 8 ECC check bit word is tied to four 72 bit columns in a row. In one example, for a ×16 device, no additional prefetch is required as the prefetch is the same as the external transfer size.

In one example, on reads, a DRAM corrects any single bit errors before returning the data to the memory controller. The DRAM will not write the corrected data back to the array during a read cycle. For double bit errors, the ECC code may miscorrect the error into a triple bit error. In the case of the aliased triple bit error, if the double bit error occurs in the top half of the code word, the code is constructed to cause the miscorrection to occur in the bottom half of the code word. And likewise, if a double bit error occurs in the bottom half of the code word, the miscorrection will occur in a quadrant other than the quadrant in which the error is found.

In one example, on writes, a DRAM computes ECC and writes data and ECC bits to the array. If the external data transfer size is smaller than the 128 bit code word (e.g., for ×4 and ×8 devices), the DRAM can perform an internal "read-modify-write" operation to read extra portions of the array out, modify the group of data, and then write the modified data back with the new data. In one example, the DRAM corrects any single bit errors that result from the internal read before merging the incoming write data. In one example, the DRAM recomputes the ECC check bits before writing data and ECC bits to the array. In the case of a ×16 DRAM, no internal read is required.

Figure 7:
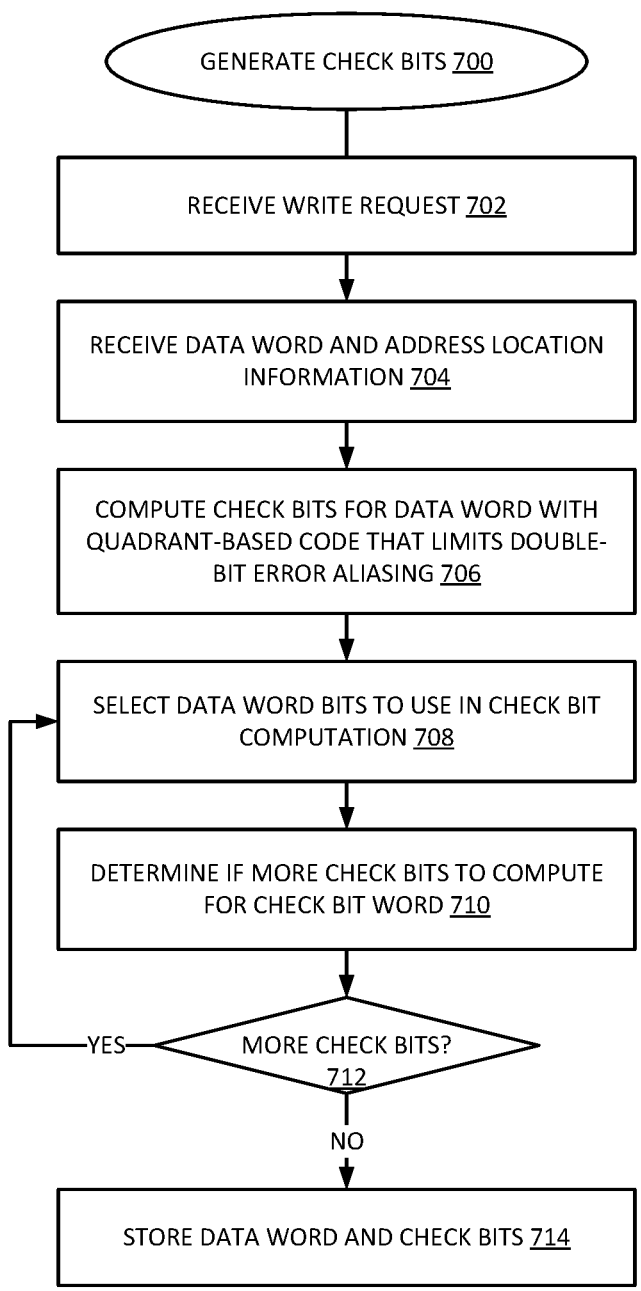
FIG. 7 is a flow diagram of an example of a process for generating check bits.

FIG. 7 is a flow diagram of an example of a process for generating check bits. Process 700 for generating check bits is to be performed by an ECC engine in accordance with an example described herein. A memory device receives a write request, 702, and receives data word and address location information for the write request, 704. In one example, the memory device includes an internal ECC engine to compute check bits for the data word, 706. The memory device can store the check bits for later use in performing ECC on reads to reduce the number of erroneous data bits returned to the memory controller. In one example, the check bits are from a code treated as quadrant-based information that steers aliasing. The quadrant-based code can be in accordance with any example described herein. The code can prevent aliasing that causes errors in adjacent quadrants.

In one example, the ECC engine selects data word bits and routes them to logic to compute a check bit, 708. The ECC engine can repeat the check bit calculation for all check bits in a check bit word (e.g., 8 bits for a 128 bit data word). In one example, the calculation includes XOR logic as described above. In one example, the ECC engine includes parallel logic for all check bits to be calculated in parallel (e.g., different paths with separate logic). Conceptually, process 700 represents the ECC engine determining if more check bits are to be computed to illustrate that separate computations can be performed for each of the separate check bits, 710. If there are more check bits to calculate, 712 YES branch, the ECC engine selects the data word bits for the following check bit, which will be a different pattern of bits from the previous check bit, 708, and will repeat for all check bits. When there are no more check bits to calculate, 712 NO branch, the memory device stores the data word and its associated check bits in the memory array, 714.

Figure 8:
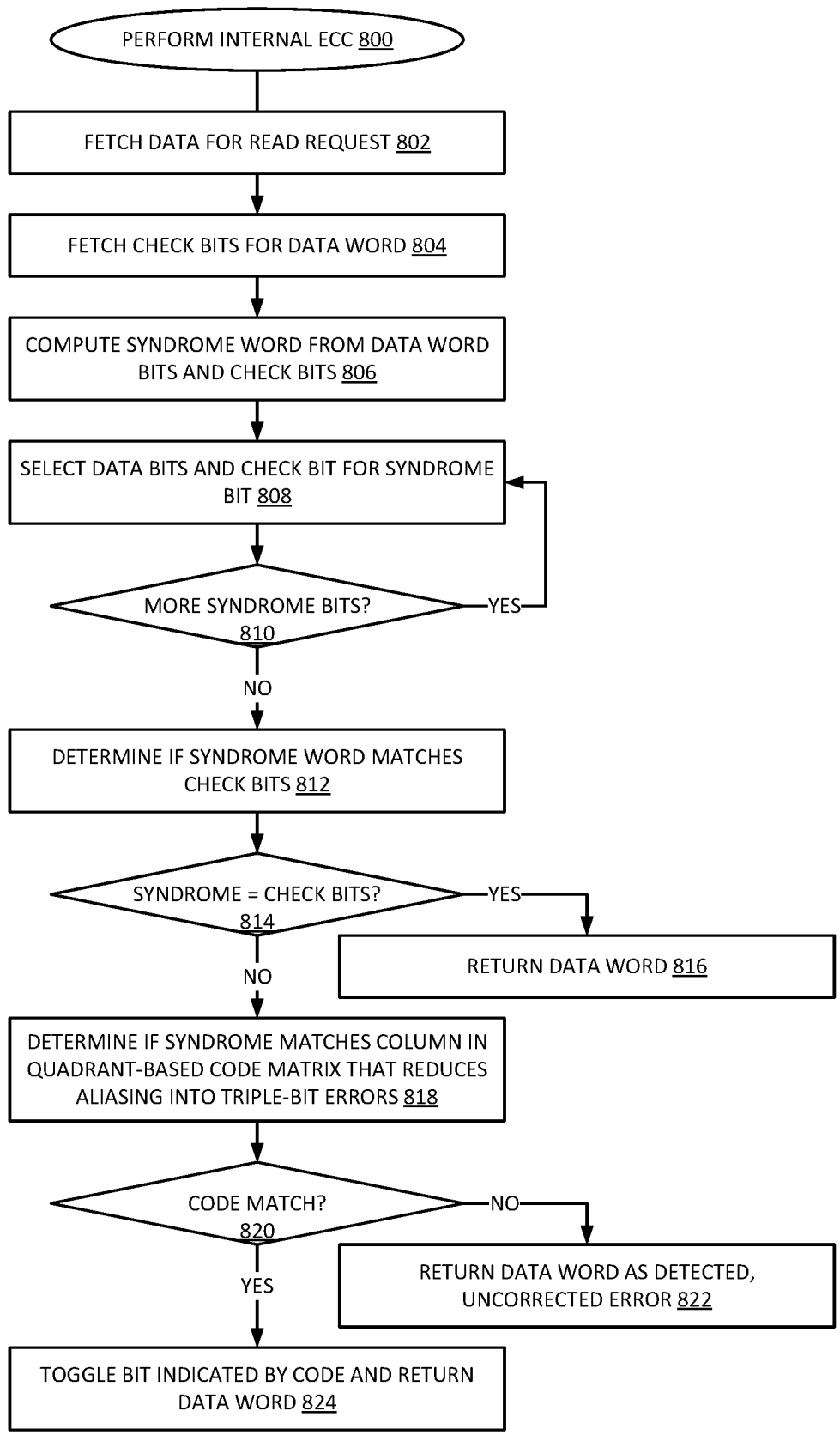
FIG. 8 is a flow diagram of an example of a process for performing ECC with a quadrant-based code matrix that prevents aliasing that causes errors in adjacent quadrants.

FIG. 8 is a flow diagram of an example of a process for performing ECC with a quadrant-based code matrix that prevents aliasing that causes errors in adjacent quadrants. Process 800 for performing internal ECC is to be performed by an ECC engine with a quadrant-based code in accordance with an example described herein. In one example, process 800 includes a common path with process 800 in computing the syndrome. A memory device receives a read request and fetches a data word from the address location identified in the read request, 802. The memory device fetches check bits associated with the data word, 804.

In one example, the memory device includes an internal ECC engine to compute syndrome bits for the data word, 806. The memory device can use the stored check bits to correct single bit errors to reduce the number of erroneous data bits returned to the memory controller. In one example, the ECC engine selects data word bits and an associated check bit and routes them to logic to compute a syndrome bit, 808. The ECC engine can repeat the check bit calculation for all syndrome bits to be computed (e.g., 8 bits for a 128 bit data word). In one example, the calculation includes XOR logic as described above. In one example, the ECC engine includes parallel logic for all check bits to be calculated in parallel (e.g., different paths with separate logic). Conceptually, process 800 represents the ECC engine determining if more syndrome bits are to be computed to illustrate that separate computations can be performed for each of the separate syndrome bits, 810.

If there are more syndrome bits to calculate, 810 YES branch, the ECC engine selects the data word bits and check bit for the following syndrome bit, which will be a different pattern of bits from the previous syndrome bit and a matching pattern of bits to the selected check bit, 808, and will repeat for all check bits. When there are no more syndrome bits to calculate, 810 NO branch, in one example, the ECC engine determines if the syndrome word matches the corresponding check bit word, 812. As mentioned above, such a determination can be accomplished by XORing each syndrome bit with the corresponding check bit to determine if there is a zero syndrome or non-zero syndrome. A non-zero syndrome indicates an error in the code word. In accordance with an example of a code matrix, the code can steer error aliasing in the case of multibit errors. Thus, instead of creating an additional error in an adjacent quadrant of a code matrix, the code can be designed to trigger an error in a quadrant other than the adjacent quadrant. If all quadrants either contain an error or are adjacent to a quadrant that contains an error, then the ECC engine will recognize that an uncorrectable error has occurred and no aliasing will be triggered.

If the syndrome bits are all zero, 814 YES branch, the ECC engine can identify the data as no errors, and the memory device can return the data word to the memory controller, 816. If the syndrome bits are not all zero, 814 NO branch, the ECC engine can determine if the syndrome matches a column in the code matrix, 818. The code matrix is a code matrix in accordance with what is described herein, wherein the code is quadrant based or organized in quadrants. The code can prevent aliasing into an adjacent quadrant, which reduces the likelihood of aliasing into a triple bit error.

The ECC engine can determine when there is a code match between the syndrome and a code of the matrix, 820 YES branch, and toggle the data bit indicated by the code, and return the corrected data word, 824. The ECC engine can determine when there is not a code match, 820 NO branch, and return the data word uncorrected to the memory controller as having a detected, uncorrected error, 822.

Figure 9:
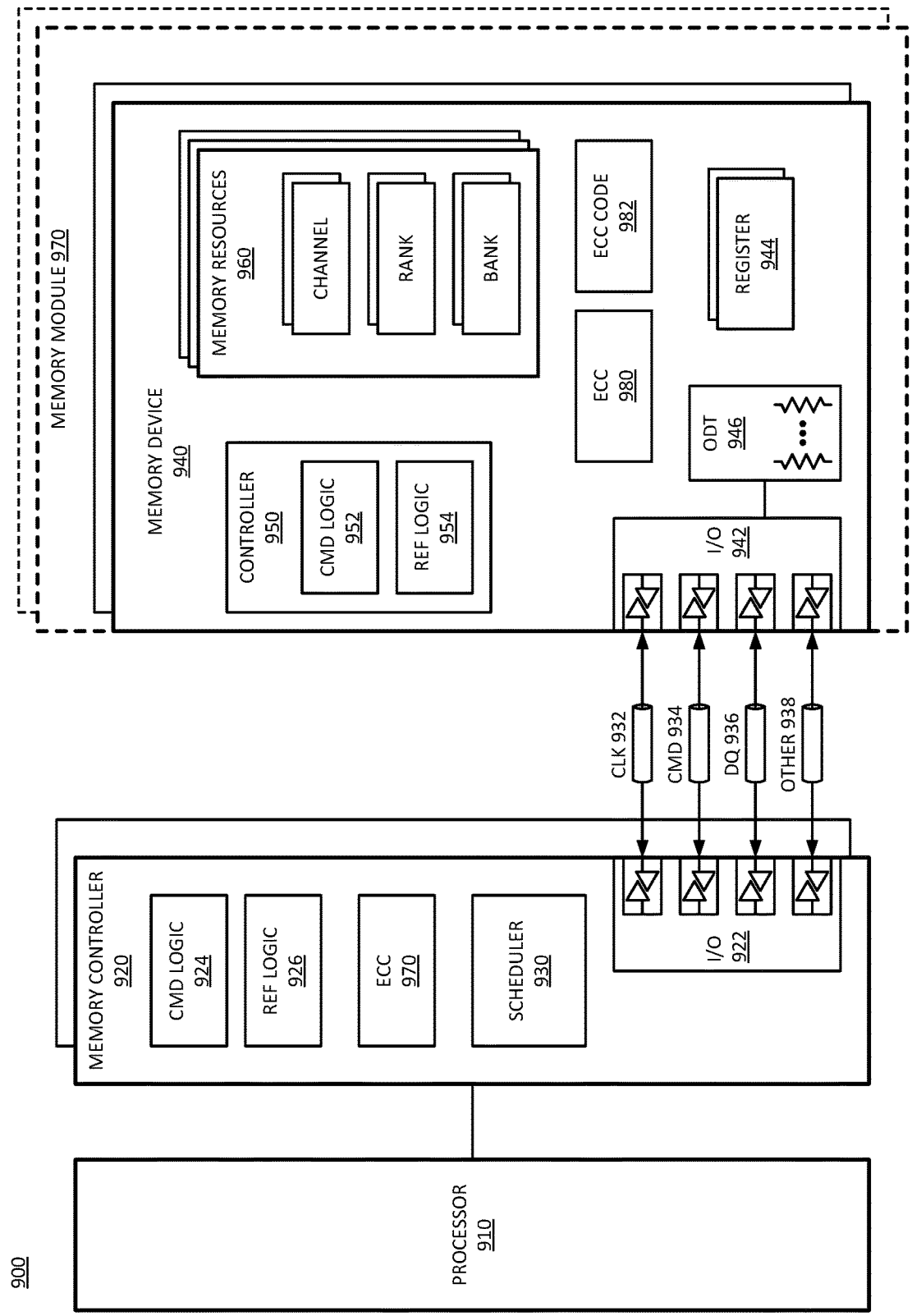
FIG. 9 is a block diagram of an example of a system in which a memory device performs ECC with a quadrant-based code matrix that prevents aliasing that causes errors in adjacent quadrants.

FIG. 9 is a block diagram of an example of a system in which a memory device performs ECC with a quadrant-based code matrix that prevents aliasing that causes errors in adjacent quadrants. System 900 includes a processor and elements of a memory subsystem in a computing device. Processor 910 represents a processing unit of a computing platform that may execute an operating system (OS) and applications, which can collectively be referred to as the host or the user of the memory. The OS and applications execute operations that result in memory accesses. Processor 910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 900 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 920 represents one or more memory controller circuits or devices for system 900. Memory controller 920 represents control logic that generates memory access commands in response to the execution of operations by processor 910. Memory controller 920 accesses one or more memory devices 940. Memory devices 940 can be DRAM devices in accordance with any referred to above. In one example, memory devices 940 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 920 manages a separate memory channel, although system 900 can be configured to have multiple channels managed by a single controller, or to have multiple controllers on a single channel. In one example, memory controller 920 is part of host processor 910, such as logic implemented on the same die or implemented in the same package space as the processor.

Memory controller 920 includes I/O interface logic 922 to couple to a memory bus, such as a memory channel as referred to above. I/O interface logic 922 (as well as I/O interface logic 942 of memory device 940) can include pins, pads, connectors, signal lines, traces, or wires, or other hardware to connect the devices, or a combination of these. I/O interface logic 922 can include a hardware interface. As illustrated, I/O interface logic 922 includes at least drivers/transceivers for signal lines. Commonly, wires within an integrated circuit interface couple with a pad, pin, or connector to interface signal lines or traces or other wires between devices. I/O interface logic 922 can include drivers, receivers, transceivers, or termination, or other circuitry or combinations of circuitry to exchange signals on the signal lines between the devices. The exchange of signals includes at least one of transmit or receive. While shown as coupling I/O 922 from memory controller 920 to I/O 942 of memory device 940, it will be understood that in an implementation of system 900 where groups of memory devices 940 are accessed in parallel, multiple memory devices can include I/O interfaces to the same interface of memory controller 920. In an implementation of system 900 including one or more memory modules 970, I/O 942 can include interface hardware of the memory module in addition to interface hardware on the memory device itself. Other memory controllers 920 will include separate interfaces to other memory devices 940.

The bus between memory controller 920 and memory devices 940 can be implemented as multiple signal lines coupling memory controller 920 to memory devices 940. The bus may typically include at least clock (CLK) 932, command/address (CMD) 934, and write data (DQ) and read data (DQ) 936, and zero or more other signal lines 938. In one example, a bus or connection between memory controller 920 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 920 and memory devices 940. An example of a serial bus technology is 8B10B encoding and transmission of high-speed data with embedded clock over a single differential pair of signals in each direction. In one example, CMD 934 represents signal lines shared in parallel with multiple memory devices. In one example, multiple memory devices share encoding command signal lines of CMD 934, and each has a separate chip select (CS_n) signal line to select individual memory devices.

It will be understood that in the example of system 900, the bus between memory controller 920 and memory devices 940 includes a subsidiary command bus CMD 934 and a subsidiary bus to carry the write and read data, DQ 936. In one example, the data bus can include bidirectional lines for read data and for write/command data. In another example, the subsidiary bus DQ 936 can include unidirectional write signal lines for write and data from the host to memory, and can include unidirectional lines for read data from the memory to the host. In accordance with the chosen memory technology and system design, other signals 938 may accompany a bus or sub bus, such as strobe lines DQS. Based on design of system 900, or implementation if a design supports multiple implementations, the data bus can have more or less bandwidth per memory device 940. For example, the data bus can support memory devices that have either a ×32 interface, a ×16 interface, a ×8 interface, or other interface. The convention "×W," where W is an integer that refers to an interface size or width of the interface of memory device 940, which represents a number of signal lines to exchange data with memory controller 920. The interface size of the memory devices is a controlling factor on how many memory devices can be used concurrently per channel in system 900 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 940 and memory controller 920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 940 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 940 represent memory resources for system 900. In one example, each memory device 940 is a separate memory die. In one example, each memory device 940 can interface with multiple (e.g., 2) channels per device or die. Each memory device 940 includes I/O interface logic 942, which has a bandwidth determined by the implementation of the device (e.g., ×16 or ×8 or some other interface bandwidth). I/O interface logic 942 enables the memory devices to interface with memory controller 920. I/O interface logic 942 can include a hardware interface, and can be in accordance with I/O 922 of memory controller, but at the memory device end. In one example, multiple memory devices 940 are connected in parallel to the same command and data buses. In another example, multiple memory devices 940 are connected in parallel to the same command bus, and are connected to different data buses. For example, system 900 can be configured with multiple memory devices 940 coupled in parallel, with each memory device responding to a command, and accessing memory resources 960 internal to each. For a Write operation, an individual memory device 940 can write a portion of the overall data word, and for a Read operation, an individual memory device 940 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word will be provided or received by other memory devices in parallel.

In one example, memory devices 940 are disposed directly on a motherboard or host system platform (e.g., a PCB (printed circuit board) on which processor 910 is disposed) of a computing device. In one example, memory devices 940 can be organized into memory modules 970. In one example, memory modules 970 represent dual inline memory modules (DIMMs). In one example, memory modules 970 represent other organization of multiple memory devices to share at least a portion of access or control circuitry, which can be a separate circuit, a separate device, or a separate board from the host system platform. Memory modules 970 can include multiple memory devices 940, and the memory modules can include support for multiple separate channels to the included memory devices disposed on them. In another example, memory devices 940 may be incorporated into the same package as memory controller 920, such as by techniques such as multi-chip-module (MCM), package-on-package, through-silicon via (TSV), or other techniques or combinations. Similarly, in one example, multiple memory devices 940 may be incorporated into memory modules 970, which themselves may be incorporated into the same package as memory controller 920. It will be appreciated that for these and other implementations, memory controller 920 may be part of host processor 910.

Memory devices 940 each include memory resources 960. Memory resources 960 represent individual arrays of memory locations or storage locations for data. Typically memory resources 960 are managed as rows of data, accessed via wordline (rows) and bitline (individual bits within a row) control. Memory resources 960 can be organized as separate channels, ranks, and banks of memory. Channels may refer to independent control paths to storage locations within memory devices 940. Ranks may refer to common locations across multiple memory devices (e.g., same row addresses within different devices). Banks may refer to arrays of memory locations within a memory device 940. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 940 include one or more registers 944. Register 944 represents one or more storage devices or storage locations that provide configuration or settings for the operation of the memory device. In one example, register 944 can provide a storage location for memory device 940 to store data for access by memory controller 920 as part of a control or management operation. In one example, register 944 includes one or more Mode Registers. In one example, register 944 includes one or more multipurpose registers. The configuration of locations within register 944 can configure memory device 940 to operate in different "modes," where command information can trigger different operations within memory device 940 based on the mode. Additionally or in the alternative, different modes can also trigger different operation from address information or other signal lines depending on the mode. Settings of register 944 can indicate configuration for I/O settings (e.g., timing, termination or ODT (on-die termination) 946, driver configuration, or other I/O settings).

In one example, memory device 940 includes ODT 946 as part of the interface hardware associated with I/O 942. ODT 946 can be configured as mentioned above, and provide settings for impedance to be applied to the interface to specified signal lines. In one example, ODT 946 is applied to DQ signal lines. In one example, ODT 946 is applied to command signal lines. In one example, ODT 946 is applied to address signal lines. In one example, ODT 946 can be applied to any combination of the preceding. The ODT settings can be changed based on whether a memory device is a selected target of an access operation or a non-target device. ODT 946 settings can affect the timing and reflections of signaling on the terminated lines. Careful control over ODT 946 can enable higher-speed operation with improved matching of applied impedance and loading. ODT 946 can be applied to specific signal lines of I/O interface 942, 922, and is not necessarily applied to all signal lines.

Memory device 940 includes controller 950, which represents control logic within the memory device to control internal operations within the memory device. For example, controller 950 decodes commands sent by memory controller 920 and generates internal operations to execute or satisfy the commands. Controller 950 can be referred to as an internal controller, and is separate from memory controller 920 of the host. Controller 950 can determine what mode is selected based on register 944, and configure the internal execution of operations for access to memory resources 960 or other operations based on the selected mode. Controller 950 generates control signals to control the routing of bits within memory device 940 to provide a proper interface for the selected mode and direct a command to the proper memory locations or addresses. Controller 950 includes command logic 952, which can decode command encoding received on command and address signal lines. Thus, command logic 952 can be or include a command decoder. With command logic 952, memory device can identify commands and generate internal operations to execute requested commands.

Referring again to memory controller 920, memory controller 920 includes command (CMD) logic 924, which represents logic or circuitry to generate commands to send to memory devices 940. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 940, memory controller 920 can issue commands via I/O 922 to cause memory device 940 to execute the commands. In one example, controller 950 of memory device 940 receives and decodes command and address information received via I/O 942 from memory controller 920. Based on the received command and address information, controller 950 can control the timing of operations of the logic and circuitry within memory device 940 to execute the commands. Controller 950 is responsible for compliance with standards or specifications within memory device 940, such as timing and signaling requirements. Memory controller 920 can implement compliance with standards or specifications by access scheduling and control.

Memory controller 920 includes scheduler 930, which represents logic or circuitry to generate and order transactions to send to memory device 940. From one perspective, the primary function of memory controller 920 could be said to schedule memory access and other transactions to memory device 940. Such scheduling can include generating the transactions themselves to implement the requests for data by processor 910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 920 typically includes logic such as scheduler 930 to allow selection and ordering of transactions to improve performance of system 900. Thus, memory controller 920 can select which of the outstanding transactions should be sent to memory device 940 in which order, which is typically achieved with logic much more complex that a simple first-in first-out algorithm. Memory controller 920 manages the transmission of the transactions to memory device 940, and manages the timing associated with the transaction. In one example, transactions have deterministic timing, which can be managed by memory controller 920 and used in determining how to schedule the transactions with scheduler 930.

In one example, memory controller 920 includes refresh (REF) logic 926. Refresh logic 926 can be used for memory resources that are volatile and need to be refreshed to retain a deterministic state. In one example, refresh logic 926 indicates a location for refresh, and a type of refresh to perform. Refresh logic 926 can trigger self-refresh within memory device 940, or execute external refreshes which can be referred to as auto refresh commands) by sending refresh commands, or a combination. In one example, system 900 supports all bank refreshes as well as per bank refreshes. All bank refreshes cause the refreshing of banks within all memory devices 940 coupled in parallel. Per bank refreshes cause the refreshing of a specified bank within a specified memory device 940. In one example, controller 950 within memory device 940 includes refresh logic 954 to apply refresh within memory device 940. In one example, refresh logic 954 generates internal operations to perform refresh in accordance with an external refresh received from memory controller 920. Refresh logic 954 can determine if a refresh is directed to memory device 940, and what memory resources 960 to refresh in response to the command.

In one example, memory controller 920 includes error checking and correction logic (ECC) 970 to perform system-level ECC for system 900. System-level ECC refers to application of error correction at memory controller 920, and can apply error correction to data bits from multiple different memory devices 940. ECC 970 represents circuitry or logic to enable system-level ECC operations, such as double bit error correction.

In one example, memory device 940 includes internal ECC 980, which can also be referred to as on-die ECC. In one example, internal ECC 980 represents SEC ECC logic within memory device 940. In one example, ECC 980 operates on internal ECC code 982, which represents a code matrix having quadrant based codes to steer aliasing. The code prevents aliasing to a quadrant adjacent to a quadrant where an error was detected, in accordance with any example herein.

Figure 10:
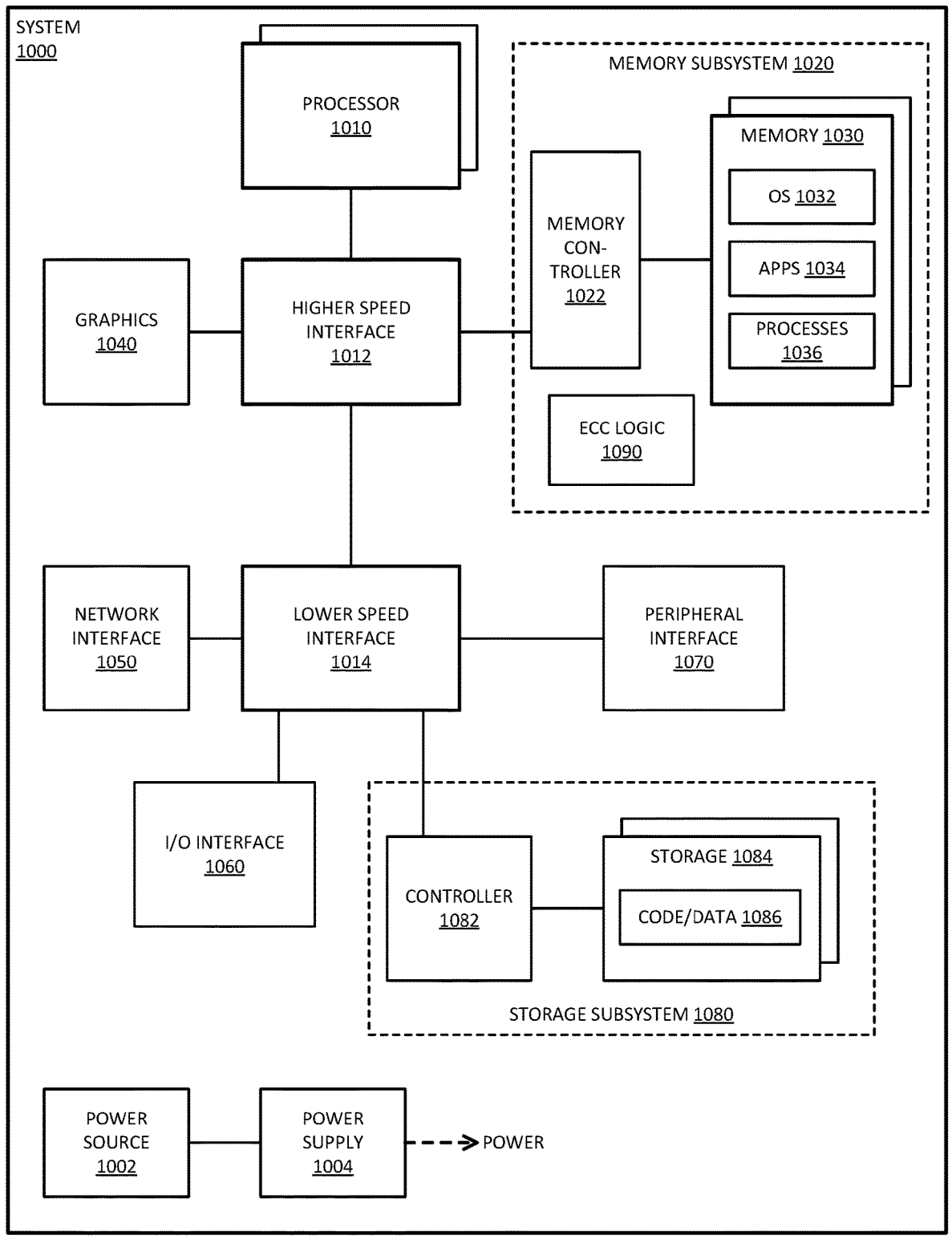
FIG. 10 is a block diagram of an example of a computing system in which a memory device performs internal ECC with a quadrant-based code matrix that prevents aliasing that causes errors in adjacent quadrants can be implemented.

FIG. 10 is a block diagram of an example of a computing system in which a memory device performs internal ECC with a quadrant-based code matrix that prevents aliasing that causes errors in adjacent quadrants can be implemented. System 1000 represents a computing device in accordance with any example herein, and can be a laptop computer, a desktop computer, a tablet computer, a server, a gaming or entertainment control system, embedded computing device, or other electronic device.

In one example, memory 1032 is a DRAM. In one example, processor 1020 represents one or more processors that execute data stored in one or more DRAM memories 1032. In one example, network interface 1050 exchanges data with another device in another network location, and the data is data stored in memory 1032. In one example, system 1000 includes ECC logic 1080 to perform internal ECC within a memory, and thus ECC logic 1080 could be at least partially represented within memory 1032. ECC logic 1080 can also represent system-wide ECC at memory controller 1034, which uses the fact that memory 1032 performs internal ECC to provide more robust ECC for system 1000. ECC logic 1080 with respect to internal ECC in memory 1032 includes a code matrix in accordance with any example described herein. Thus, ECC logic 1080 operates in accordance with a code matrix treated as separate quadrants or segments, which can steer aliasing. The code prevents aliasing to a quadrant adjacent to a quadrant where an error was detected, in accordance with any example herein.

In one example, system 1000 includes power management 1090 to provide power to system 1000. In one example, power management 1090 includes power control logic to provide gating control and reset control to core circuitry including processor 1010 and interface 1012. The power control logic also provides gating and reset control to memory controller 1022 and the interfaces for memory 1030. In one example, system 1000 also includes test power control 1092, which can be test control in accordance with an example herein. Test power control 1092 provides selective enabling of memory I/O for platform testing of a platform in which system 1000 is incorporated.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1002 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
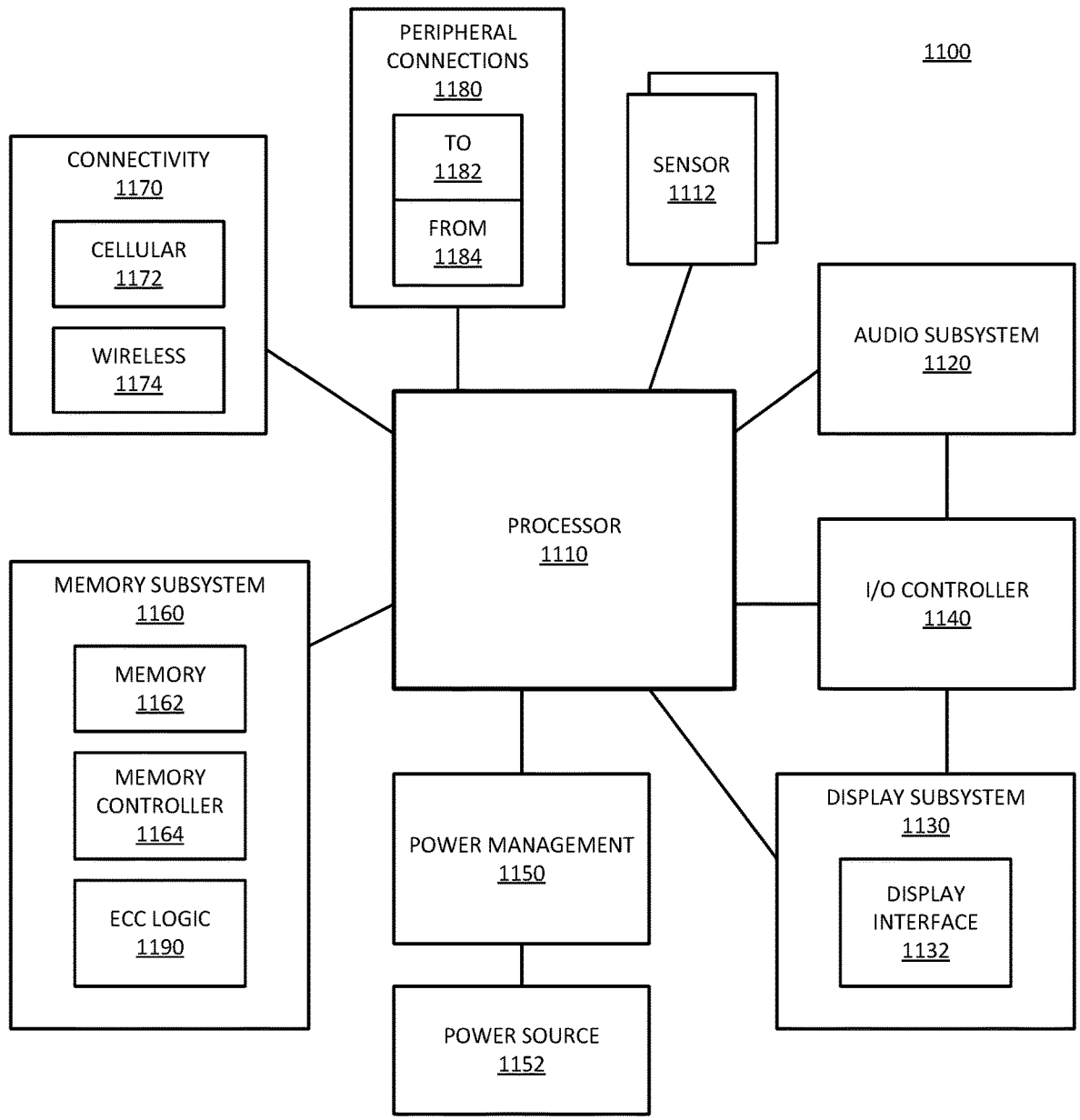
FIG. 11 is a block diagram of an example of a mobile device in which a memory device performs internal ECC with a quadrant-based code matrix that prevents aliasing that causes errors in adjacent quadrants can be implemented.

FIG. 11 is a block diagram of an example of a mobile device in which a memory device performs internal ECC with a quadrant-based code matrix that prevents aliasing that causes errors in adjacent quadrants can be implemented. Device 1100 represents a mobile computing device, such as a computing tablet, a mobile phone or smartphone, wearable computing device, or other mobile device, or an embedded computing device. It will be understood that certain of the components are shown generally, and not all components of such a device are shown in device 1100.

In one example, memory 1162 is a DRAM. In one example, processor 1110 represents one or more processors that execute data stored in one or more DRAM memories 1162. In one example, connectivity 1170 includes a network interface to exchange data with another device in another network location, and the data is data stored in memory 1162. In one example, system 1100 includes ECC logic 1190 to perform internal ECC within a memory, and thus ECC logic 1190 could be at least partially represented within memory 1162. ECC logic 1190 can also represent system-wide ECC at memory controller 1164, which uses the fact that memory 1162 performs internal ECC to provide more robust ECC for system 1100. ECC logic 1190 with respect to internal ECC in memory 1162 includes a code matrix in accordance with any example described herein. Thus, ECC logic 1190 operates in accordance with a code matrix that can be operated in multiple segment corresponding to multiple segments of the data words for read and write operations. Thus, ECC logic 1190 operates in accordance with a code matrix treated as separate quadrants or segments, which can steer aliasing. The code prevents aliasing to a quadrant adjacent to a quadrant where an error was detected, in accordance with any example herein.

In one example, system 1100 includes power management 1150 to provide power to system 1100. While shown connected to processor 1110, power management 1150 provides power for the other components of system 1100 as well, but can be managed by processor 1110. In one example, power management 1150 includes power control logic to provide gating control and reset control to core circuitry including processor 1110 and its interfaces to the other components. The power control logic also provides gating and reset control to memory controller 1164 and the interfaces for memory 1162. In one example, system 1100 also includes memory I/O test power control logic 1190, which can be test control in accordance with an example herein. Memory I/O test logic 1190 provides selective enabling of memory I/O for platform testing of a platform in which system 1100 is incorporated.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting device 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, device 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1100, or connected to device 1100. In one example, a user interacts with device 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in device 1100, or sensors 1112. The input can be part of direct user interaction, as well as providing environmental input to the system to influence its operations (such as filtering for noise, adjusting displays for brightness detection, applying a flash for a camera, or other features).

In one example, device 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in device 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable device 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading, uploading, changing, synchronizing) content on device 1100. Additionally, a docking connector can allow device 1100 to connect to certain peripherals that allow device 1100 to control content output, for example, to audiovisual or other systems.

In one example, a memory device includes: a storage array to store an N-bit data word, and M error checking and correction (ECC) bits associated with the data word; a storage device to store an ECC code matrix, the code matrix to include N codes organized as four quadrants of (N/4) codes each, with two portions each including two adjacent quadrants, where the N codes are to correspond to the N bits of the data word, respectively, and M codes corresponding to the M ECC check bits; and ECC circuitry to perform internal ECC in the memory device with the ECC bits and code matrix in response to a request to access the data word; wherein the codes in a quadrant steer an aliased bit to a quadrant other than the adjacent quadrant.

In one example, N equals 128, and wherein the memory device includes a double data rate (DDR) compliant synchronous dynamic random access memory device (SDRAM). In one example, the ECC circuitry to perform internal ECC is to perform single bit error correction (SEC) to correct a single bit error (SBE) in N bits. In one example, in response to detection by the ECC circuitry of single bit errors in adjacent quadrants, the ECC circuitry will not alias a data bit. In one example, a bitwise XOR (exclusive OR) of any two codes is to generate a code that is not in a quadrant adjacent to an error. In one example, the memory device includes a 4-bit data I/O (input/output) interface (a ×4 data interface), and wherein each of the N codes is to provide ECC information for accesses of four separate (N/4)-bit columns of data. In one example, the memory device includes an 8-bit data I/O (input/output) interface (a ×8 data interface), and wherein each of the N codes is to provide ECC information for accesses of two separate (N/2)-bit columns of data. In one example, the memory device includes a 16-bit data I/O (input/output) interface (a ×16 data interface), and wherein each of the N codes is to provide ECC information for accesses of two separate (N/2)-bit columns, the two separate columns of data from two separate bank groups.

In one example, a system with a memory subsystem includes: a memory controller; and multiple memory devices in accordance with any example of the memory device of the preceding two paragraphs. In one example, further comprising one or more of: a multicore processor coupled to the memory controller, at least one core of the processor to execute data stored in the memory devices; a network adapter coupled to exchange data between the memory devices and a remote network location; or a display communicatively coupled to a multicore processor.

In one example, a method for error correction in a memory device includes: storing an N-bit data word, and M error checking and correction (ECC) bits associated with the data word; storing an ECC code matrix, the code matrix to include N codes organized as four quadrants of (N/4) codes each, with two portions each including two adjacent quadrants, where the N codes are to correspond to the N bits of the data word, respectively, and M codes corresponding to the M ECC check bits; and performing internal ECC in the memory device with the ECC bits and code matrix in response to a request to access the data word; wherein the codes in a quadrant steer an aliased bit to a quadrant other than an adjacent quadrant.

In one example, N equals 128, and wherein the memory device includes a double data rate (DDR) compliant synchronous dynamic random access memory device (SDRAM). In one example, performing internal ECC comprises performing single bit error correction (SEC) to correct a single bit error (SBE) in N data bits. In one example, quadrants Q1 and Q2 are two adjacent quadrants for a top (N/2) bits. In one example, quadrants Q3 and Q4 are two adjacent quadrants for a bottom (N/2) bits. In one example, in response to detecting single bit errors in adjacent quadrants, the ECC engine does not alias a data bit. In one example, a bitwise XOR (exclusive OR) of any two codes generates a code that is not in the adjacent quadrant to any quadrant that contains an error. In one example, the memory device includes a 4-bit data I/O (input/output) interface (a ×4 data interface), and wherein each of the N codes is to provide ECC information for accesses of four separate (N/4)-bit columns of data. In one example, the memory device includes an 8-bit data I/O (input/output) interface (a ×8 data interface), and wherein each of the N codes is to provide ECC information for accesses of two separate (N/2)-bit columns of data. In one example, the memory device includes a 16-bit data I/O (input/output) interface (a ×16 data interface), and wherein each of the N codes is to provide ECC information for accesses of two separate (N/2)-bit columns, the two separate columns of data from two separate bank groups.

In one example, an apparatus comprising means for performing operations to execute a method for error correction in a memory device in accordance with any example of the preceding two paragraphs. In one example, an article of manufacture comprising a computer readable storage medium having content stored thereon, which when accessed causes a machine to perform operations to execute a method for error correction in a memory device in accordance with any example of the preceding two paragraphs.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware, or software, or as a combination of hardware and software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, data, or a combination. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, or other machines), such as recordable/non-recordable media (e.g., read only memory (ROM), random access memory (RAM), magnetic disk storage media, optical storage media, flash memory devices, or other media). A communication interface includes any mechanism that interfaces to a medium of some kind such as hardwired, wireless, optical, or combination, to communicate to another device, such as a memory bus interface, a processor bus interface, an Internet connection, a disk controller, or other device. The communication interface can be configured by providing configuration parameters or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs)), embedded controllers, hardwired circuitry, or other hardware.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device, comprising:

a storage array to store an N-bit data word, and M error checking and correction (ECC) bits associated with the data word;

a storage device to store an ECC code matrix, the code matrix to include N codes organized as four quadrants of (N/4) codes each, with two portions each including two adjacent quadrants, where the N codes are to correspond to the N bits of the data word, respectively, and M codes corresponding to the M ECC check bits; and on-die ECC circuitry in the DRAM device to perform internal ECC with the ECC bits and code matrix in response to a request to access the data word;

wherein the codes in a quadrant steer an aliased bit to a quadrant other than an adjacent quadrant.

2. The DRAM device of claim 1, wherein N equals 128, and wherein the DRAM includes a double data rate (DDR) compliant synchronous dynamic random access memory device (SDRAM).

3. The DRAM device of claim 1, wherein the ECC circuitry to perform internal ECC is to perform single bit error correction (SEC) to correct a single bit error (SBE) in N data bits.

4. The DRAM device of claim 3, wherein quadrants Q1 and Q2 are two adjacent quadrants for a top (N/2) bits.

5. The DRAM device of claim 3, wherein quadrants Q3 and Q4 are two adjacent quadrants for a bottom (N/2) bits.

6. The DRAM device of claim 1, wherein in response to detection by the one-die ECC circuitry of single bit errors in adjacent quadrants, the on-die ECC circuitry will not alias a data bit.

7. The DRAM device of claim 1, wherein a bitwise XOR (exclusive OR) of any two codes is to generate a code that is not in a quadrant adjacent to a quadrant containing an error.

8. The DRAM device of claim 1, wherein the DRAM device includes a 4-bit data I/O (input/output) interface (a ×4 data interface), and wherein each of the N codes is to provide ECC information for accesses of four separate (N/4)-bit columns of data.

9. The DRAM device of claim 1, wherein the DRAM device includes an 8-bit data I/O (input/output) interface (a ×8 data interface), and wherein each of the N codes is to provide ECC information for accesses of two separate (N/2)-bit columns of data.

10. The DRAM device of claim 1, wherein the DRAM device includes a 16-bit data I/O (input/output) interface (a ×16 data interface), and wherein each of the N codes is to provide ECC information for accesses of two separate (N/2)-bit columns, the two separate N/2-bit columns from two separate bank groups.

11. A system with a memory subsystem, comprising:
a memory controller; and
multiple synchronous dynamic random access memory devices (SDRAMs) including
a storage array to store an N-bit data word, and M error checking and correction (ECC) check bits associated with the data word;
a storage device to store an ECC code matrix, the code matrix to include N codes organized as four quadrants of (N/4) codes each, with two portions each including two adjacent quadrants, where the N codes are to correspond to the N bits of the data word, respectively, and M codes corresponding to the M ECC check bits; and
on-die ECC circuitry in the DRAM device to perform internal ECC with the ECC bits and code matrix in response to a request to access the data word;
wherein the codes in a quadrant steer an aliased bit to a quadrant other than an adjacent quadrant.

12. The system of claim 11, wherein the DRAM includes a double data rate (DDR) compliant synchronous dynamic random access memory device (SDRAM).

13. The system of claim 11, wherein the ECC circuitry to perform internal ECC is to perform single bit error correction (SEC) to correct a single bit error (SBE) in N data bits.

14. The system of claim 13, wherein quadrants Q1 and Q2 are two adjacent quadrants for a top (N/2) bits.

15. The system of claim 13, wherein quadrants Q3 and Q4 are two adjacent quadrants for a bottom (N/2) bits.

16. The system of claim 11, wherein in response to detection by the on-die ECC circuitry of single bit errors in adjacent quadrants, the on-die ECC circuitry will not alias a data bit.

17. The system of claim 11, wherein a bitwise XOR (exclusive OR) of any two codes is to generate a code that is not in a quadrant adjacent to a quadrant that contains an error.

18. The system of claim 11, wherein the DRAM device includes a 4-bit data I/O (input/output) interface (a ×4 data interface), and wherein each of the N codes is to provide ECC information for accesses of four separate (N/4)-bit columns of data.

19. The system of claim 11, wherein the DRAM device includes an 8-bit data I/O (input/output) interface (a ×8 data interface), and wherein each of the N codes is to provide ECC information for accesses of two separate (N/2)-bit columns of data.

20. The system of claim 11, wherein the DRAM device includes a 16-bit data I/O (input/output) interface (a ×16 data interface), and wherein each of the N codes is to provide ECC information for accesses of two separate (N/2)-bit columns, the two separate N/2-bit columns from two separate bank groups.

21. The system of claim 11, further comprising one or more of:
a multicore processor coupled to the memory controller, at least one core of the processor to execute data stored in the DRAM devices;
a network adapter coupled to exchange data between the DRAM devices and a remote network location; or
a display communicatively coupled to a multicore processor.

* * * * *